(12) United States Patent
Li et al.

(10) Patent No.: US 12,414,381 B2
(45) Date of Patent: Sep. 9, 2025

(54) MONOLITHIC THREE-DIMENSIONAL (3D) COMPLEMENTARY FIELD EFFECT TRANSISTOR (CFET) CIRCUITS AND METHOD OF MANUFACTURE

(71) Applicant: QUALCOMM Incorporated, San Diego, CA (US)

(72) Inventors: Xia Li, San Diego, CA (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 558 days.

(21) Appl. No.: 17/818,048

(22) Filed: Aug. 8, 2022

(65) Prior Publication Data
US 2024/0047455 A1 Feb. 8, 2024

(51) Int. Cl.
H10D 88/00 (2025.01)
H01L 23/48 (2006.01)
(Continued)

(52) U.S. Cl.
CPC ......... H10D 88/00 (2025.01); H03K 19/0948 (2013.01); H10D 84/0167 (2025.01);
(Continued)

(58) Field of Classification Search
CPC ......... H01L 21/8221; H01L 21/823814; H01L 21/823871; H01L 27/0688; H01L 27/092;
(Continued)

(56) References Cited

U.S. PATENT DOCUMENTS

2013/0122672 A1* 5/2013 Or-Bach .......... H03K 19/17796
 438/455
2015/0061026 A1* 3/2015 Lin ........................ H10D 88/00
 257/369
(Continued)

FOREIGN PATENT DOCUMENTS

DE 102019121928 A1 3/2020
WO 2018118210 A1 6/2018
WO 2023099112 A1 6/2023

OTHER PUBLICATIONS

Batude, P. et al., "3D sequential integration: applications and associated key enabling modules (design & technology)," 2021 IEEE International Electron Devices Meeting (IEDM), Dec. 11-16, 2021, San Francisco, CA, USA, IEEE, 4 pages.
(Continued)

Primary Examiner — Earl N Taylor
(74) Attorney, Agent, or Firm — Withrow & Terranova, PLLC

(57) ABSTRACT

A monolithic 3D complementary field-effect transistor (FET) (CFET) circuit includes a first CFET structure and a second CFET structure in a logic circuit within a device layer. A first interconnect layer disposed on the device layer provides first and second input contacts and an output contact of a logic circuit. Each CFET structure includes an upper FET having a first type (e.g., P-type or N-type) on a lower FET having a second type (e.g., N-type or P-type). The FETs in the monolithic 3D CFET circuit may be interconnected to form a two-input NOR circuit or a two-input NAND circuit. Vertical access interconnects (vias) may be formed within the device layer to interconnect the FETs externally and to each other. The FETs may be formed as bulk-type transistors or SOI transistors.

17 Claims, 15 Drawing Sheets

(51) Int. Cl.
  *H03K 19/0948* (2006.01)
  *H10D 84/01* (2025.01)
  *H10D 84/03* (2025.01)
  *H10D 84/83* (2025.01)
  *H10D 84/85* (2025.01)

(52) U.S. Cl.
  CPC ....... *H10D 84/017* (2025.01); *H10D 84/0186* (2025.01); *H10D 84/038* (2025.01); *H10D 84/8311* (2025.01); *H10D 84/8312* (2025.01); *H10D 84/851* (2025.01); *H01L 23/481* (2013.01)

(58) Field of Classification Search
  CPC ........... H01L 29/20673; H01L 29/0847; H01L 29/42392; H01L 29/66439; H01L 29/775; H01L 29/78696; H01L 23/481; H01L 23/5286; H10D 88/00; H10D 84/0167; H10D 84/017; H10D 84/0186; H10D 84/038; H10D 84/8311; H10D 84/8312; H10D 84/851; H10D 30/014; H10D 30/43; H10D 30/6735; H10D 30/6757; H10D 62/151; H10D 62/121; H10D 84/85; H10D 88/01; H03K 19/0948; B82Y 10/00
  See application file for complete search history.

(56) References Cited

U.S. PATENT DOCUMENTS

| | | | |
|---|---|---|---|
| 2020/0075592 A1* | 3/2020 | Liebmann | H10D 62/235 |
| 2020/0235098 A1 | 7/2020 | Li et al. | |
| 2021/0218398 A1* | 7/2021 | Hung | G05F 3/16 |
| 2021/0242125 A1* | 8/2021 | Do | H10D 62/121 |
| 2021/0305278 A1* | 9/2021 | Shiraki | H10D 84/038 |
| 2022/0122892 A1* | 4/2022 | Smith | H10D 84/85 |
| 2022/0123023 A1* | 4/2022 | Peng | H10D 86/441 |
| 2022/0375935 A1* | 11/2022 | Yim | H10D 84/856 |
| 2023/0027780 A1 | 1/2023 | Kang et al. | |
| 2023/0036597 A1* | 2/2023 | Smith | H10D 84/856 |
| 2023/0068364 A1 | 3/2023 | Choi et al. | |
| 2023/0178435 A1* | 6/2023 | Huang | H10D 30/43 257/351 |
| 2023/0178554 A1* | 6/2023 | Chehab | H10D 84/0186 257/351 |
| 2023/0326925 A1* | 10/2023 | Cockburn | H01L 21/02532 257/351 |
| 2023/0377998 A1* | 11/2023 | Smith | H01L 23/5286 |
| 2023/0386928 A1* | 11/2023 | Chan | H10D 88/01 |
| 2023/0420531 A1 | 12/2023 | Lavric et al. | |
| 2023/0420544 A1* | 12/2023 | Mertens | H10D 84/0186 |
| 2024/0021586 A1* | 1/2024 | Li | H10D 84/0167 |
| 2024/0047342 A1* | 2/2024 | Smith | H10D 62/151 |
| 2025/0024745 A1 | 1/2025 | Lao et al. | |
| 2025/0048690 A1* | 2/2025 | Chehab | H10D 88/01 |

OTHER PUBLICATIONS

Clark, "Selective and Atomic Scale Processes for Advanced Semiconductor Manufacturing," 2021 IEEE International Electron Devices Meeting (IEDM), Dec. 11-16, 2021, San Francisco, CA, USA, IEEE, 55 pages.

Colombeau, B., "Processes and Materials Engineering Innovations for Advanced Logic Transistor Scaling," 2021 EEE International Electron Devices Meeting (IEDM), Dec. 11-16, 2021, San Francisco, CA, USA, IEEE, 44 pages.

Koret, R., "Metrology and Material Characterization for the Era of 3D Logic and MemorY," 2021 IEEE International Electron Devices Meeting (IEDM), Dec. 11-16, 2021, San Francisco, CA, USA, IEEE, 61 pages.

Liebmann, L. et al., "CFET Design Options, Challenges, and Opportunities for 3D Integration," 2021 IEEE International Electron Devices Meeting (IEDM), Dec. 11-16, 2021, San Francisco, CA, USA, IEEE, 4 pages.

Lin, C.-H., "Beyond FinFET Devices: GAA, CFET, 2D Material FET," 2021 IEEE International Electron Devices Meeting (IEDM), Dec. 11-16, 2021, San Francisco, CA, USA, IEEE, 56 pages.

Yang, M. et al., "Hybrid-Orientation Technology (HOT): Opportunities and Challenges," IEEE Transactions on Electron Devices, vol. 53, No. 5, May 2006, pp. 965-978.

Zhao, Kai, "Beyond FINFET era Challenges and Opportunities for CMOS Technology," 2021 IEEE International Electron Devices Meeting (IEDM), Dec. 11-16, 2021, San Francisco, CA, USA, IEEE, available online: <URL: https://static1.squarespace.com/static/607da9820de541322b95fc19/t/60f99782c7127c7fcf0a2ebf/1626969986848/1-KaiZhao.pdf >, 57 pages.

Radosavljevic, M. et al., "Opportunities in 3-D stacked CMOS transistors," 2021 IEEE International Electron Devices Meeting (IEDM), Dec. 11-16, 2021, San Francisco, CA, USA, IEEE 4 pages.

Invitation to Pay Additional Fees and Partial International Search for International Patent Application No. PCT/US2023/023977, mailed Sep. 22, 2023, 9 pages.

International Search Report and Written Opinion for International Patent Application No. PCT/US2023/023981, mailed Sep. 13, 2023, 21 pages.

* cited by examiner

MONOLITHIC THREE-DIMENSIONAL (3D) COMPLEMENTARY FIELD EFFECT TRANSISTOR (CFET) CIRCUITS AND METHOD OF MANUFACTURE

BACKGROUND

I. Field of the Disclosure

The technology of the disclosure relates generally to complementary metal-oxide-semiconductor (CMOS) field-effect transistors (FETs) (CFETs) and particularly to monolithic three-dimensional (3D) CFET circuits.

II. Background

Complementary metal-oxide-semiconductor (CMOS) technology is commonly employed in digital logic in integrated circuits (ICs) for power efficiency, performance, and noise immunity compared to circuits including only N-type (MOS) (NMOS) or P-type MOS (PMOS) technology. A CMOS logic circuit includes at least one PMOS transistor and at least one NMOS transistor. Thus, a CMOS field effect transistor (FET) (CFET) circuit includes at least one PMOS FET (PFET) and at least one NMOS FET (NFET). An IC may include logic circuits made of millions of interconnected CFETs. Therefore, the area of an IC occupied by the CFET circuits may be significantly reduced by layering FETs in three-dimensional (3D) structures. To fabricate ICs in which a FET of one type (e.g., N-type or P-type) is on top of (e.g., above) a FET of the other type (e.g., P-type or N-type), wafer-to-wafer layer transfer methods have been employed. However, in addition to process problems associated with transfer methods, existing methods consume a significant area for interconnecting the FETs in CFET logic circuits.

SUMMARY

Aspects disclosed in the detailed description include monolithic three-dimensional (3D) complementary field-effect transistor (FET) (CFET) circuits. Related methods of manufacturing monolithic 3D CFET circuits are also disclosed. 3D CFET circuits configured as logic circuits include first and second monolithic CFET structures in a device layer of an integrated circuit (IC). Each monolithic CFET structure includes an upper FET of a first type (e.g., P-type or N-type) on a lower FET of a second type (e.g., N-type or P-type). The CFET circuits also include interconnect layers disposed on the device layer to provide contacts for external circuits to couple to inputs and output(s) of logic circuits. In particular, a first input contact couples to gates of the FETs in the first CFET structure, and a second input contact couples to gates of the FETs in the second CFET structure. The output contact is coupled to an output of the CFET circuit. In some examples, the CFET circuit includes vertical access interconnects (vias) in the device layer to interconnect the FETs to each other and to the contact layer. In some examples, the first and second monolithic CFET structures are interconnected to form a two-input NOR circuit. In some examples, the first and second monolithic CFET structures are interconnected to form a two-input Not-AND (NAND) circuit.

In an exemplary aspect, a monolithic complementary field-effect transistor (CFET) logic circuit comprising a device layer and a first interconnect layer disposed on the device layer is disclosed. The device layer comprises a first CFET structure comprising a first FET of a first type on a second FET of a second type and a second CFET structure comprising a third FET of the first type on a fourth FET of the second type. The first interconnect layer comprises a first input contact configured to couple a first input signal to a gate of the first FET and to a gate of the second FET; a second input contact configured to couple a second input signal to a gate of the third FET and to a gate of the fourth FET, and an output contact configured to generate an output signal based on a logical operation of the first input signal and the second input signal.

In another exemplary aspect, an integrated circuit (IC) comprising a monolithic complementary field-effect transistor (CFET) logic circuit is disclosed. The monolithic 3D CFET circuit comprises a monolithic complementary field-effect transistor (CFET) logic circuit, comprising a device layer and a first interconnect layer disposed on the device layer. The device layer comprises a first CFET structure comprising a first FET of a first type above a second FET of a second type and a second CFET structure comprising a third FET of the first type on a fourth FET of the second type. The first interconnect layer comprises a first input contact configured to couple a first input. The first interconnect layer comprises a first input contact configured to couple a first input signal to a gate of the first FET and to a gate of the second FET; a second input contact configured to couple a second input signal to a gate of the third FET and to a gate of the fourth FET, and an output contact configured to generate an output signal based on a logical operation of the first input signal and the second input signal.

In another exemplary aspect, a method of forming a monolithic complementary field-effect transistor (CFET) logic circuit is disclosed. The method comprises forming a device layer, comprising forming a first CFET structure comprising a first FET of a first type on a second FET of a second type and forming a second CFET structure comprising a third FET of the first on a fourth FET of the second type. The method includes forming a first interconnect layer disposed on the device layer, the first interconnect layer comprising: a first input contact configured to couple a first input signal to a gate of the first FET and to a gate of the second FET; a second input contact configured to couple a second input signal to a gate of the third FET and a gate of the fourth FET; and an output contact configured to generate an output signal based on a logical operation of the first input signal and the second input signal.

DETAILED DESCRIPTION

Figure 1:
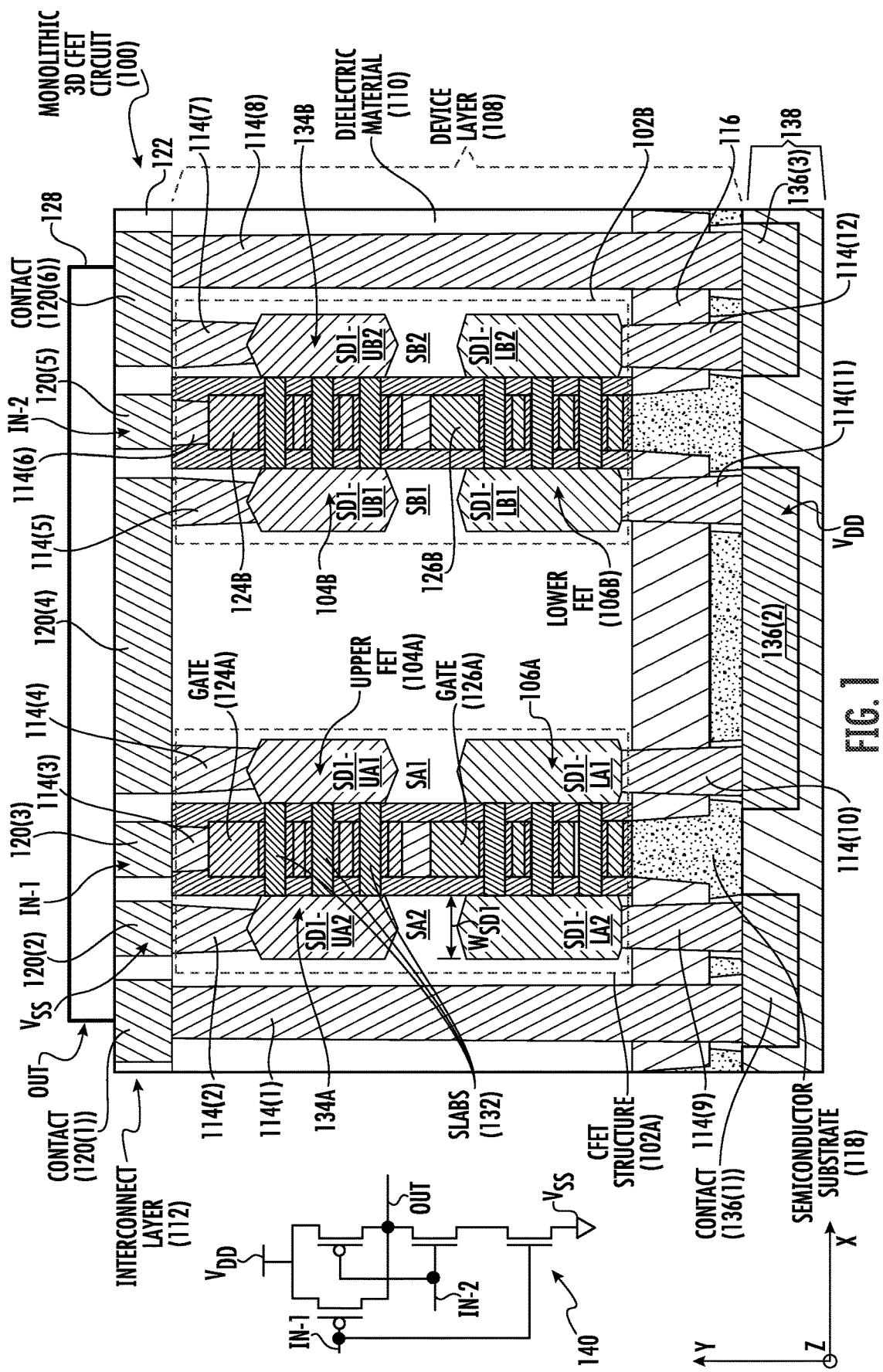
FIG. 1 is a cross-sectional side view of a monolithic 3D complementary field-effect transistor (FET) (CFET) circuit, including interconnected CFET structures on a semiconductor substrate in a first configuration of a logic circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include monolithic three-dimensional (3D) complementary field-effect transistor (FET) (CFET) circuits. Related methods of manufacturing monolithic 3D CFET circuits are also disclosed. 3D CFET circuits configured as logic circuits include first and second monolithic CFET structures in a device layer of an integrated circuit (IC). Each monolithic CFET structure includes an upper FET of a first type (e.g., P-type or N-type) on a lower FET of a second type (e.g., N-type or P-type). The CFET circuits also include interconnect layers disposed on the device layer to provide contacts for external circuits to couple to inputs and output(s) of logic circuits. In particular, a first input contact couples to gates of the FETs in the first CFET structure, and a second input contact couples to gates of the FETs in the second CFET structure. The output contact is coupled to an output of the CFET circuit. In some examples, the CFET circuit includes vertical access interconnects (vias) in the device layer to interconnect the FETs to each other and to the contact layer. In some examples, the first and second monolithic CFET structures are interconnected to form a two-input NOR circuit. In some examples, the first and second monolithic CFET structures are interconnected to form a two-input Not-AND (NAND) circuit.

CMOS circuits provide increased performance, reduced power consumption, and better noise tolerance than circuits with only one type of FET. CMOS circuits include at least one N-type FET, which provides a good reference voltage source (e.g., ground or $V_{SS}$), and at least one P-type FET, which provides a good supply voltage source (e.g., 1.8 volts or $V_{DD}$). The term "first type" as used herein may refer to either one of N-type or P-type, and the term "second type" refers to the other one of the N-type and P-type. N-type and P-type FETs may also be referred to as N-channel and P-channel FETs or NFETs and PFETs, respectively. In an N-type device, the semiconductor source and drain are doped with a pentavalent dopant, and a supply voltage applied to a gate in the channel region creates an N-channel in which electrons are the majority carrier. In a P-type or P-channel device, the semiconductor source and drain are doped with a trivalent dopant, and a reference voltage (e.g., ground) applied to the gate creates a P-channel in the channel region wherein holes are the majority carriers.

The examples shown in FIGS. 1-12 are gate-all-around (GAA) FETs, but CFET structures having FETs with other channel structures are within the scope of the present disclosure.

FIG. 1 is a cross-sectional side view of a monolithic 3D CFET circuit 100, including CFET structures 102A and 102B that include upper FETs 104A, 104B, respectively, disposed on (e.g., above in the Y-axis direction) lower FETs 106A, 106B, respectively. The CFET structures 102A, 102B are monolithic CFET structures in a device layer 108 in which the CFET structures 102A, 102B are disposed in a dielectric material 110. A thickness $T_{110}$ of the dielectric material 110 may be considered a thickness of the device layer 108. Monolithic CFET structures, as the term is employed herein, indicate structures that are formed (e.g., built up) in place on a substrate in a process flow and are not comprised of portions separately fabricated and joined, stacked, or otherwise disposed one on another.

As explained further below, the upper FETs 104A, 104B, and the lower FETs 106A, 106B are interconnected to each other and also coupled to external circuits (not shown) through an interconnect layer 112 disposed on device layer 108. The upper FETs 104A, 104B, and the lower FETs 106A, 106B are coupled to external circuits and each other by vertical interconnect accesses (vias) 114 to the interconnect layer 112. The vias 114 will be discussed individually as vias 114(1)-114(12) but are referred to herein collectively as vias 114. As shown below in each of the configurations in FIGS. 1-12, vias, such as the vias 114, may be disposed in the dielectric material 110 in the device layer 108 and may also extend through the insulation layer 116 and semiconductor substrate 118, which support the CFET structures 102A, 102B in FIG. 1 to connect the upper FETs 104A, 104B, and the lower FETs 106A, 106B indirectly to the interconnect layer 112.

For example, the insulation layer 116 may be an oxide material used for shallow trench isolation (STI). The semiconductor substrate 118 may be silicon, a silicon alloy, or another semiconductor material from which the upper FETs 104A, 104B, and the lower FETs 106A, 106B are formed.

The interconnect layer 112 includes contacts 120(1)-120(6) which are electrically conductive (e.g., metal) contacts disposed in an insulating or dielectric material 122 on the device layer 108. In the routing configurations disclosed herein, such as in the monolithic 3D CFET circuit 100, CMOS logic circuits can be integrated into compact areas and provide external access to the upper FETs 104A, 104B, and the lower FETs 106A, 106B.

Each CFET structure 102A and 102B includes a P-type FET and an N-type FET for their complementary operational characteristics. The upper FETs 104A, 104B are a first type of FET, meaning that both the upper FET 104A of the first CFET structure 102A and the upper FET 104B of the second CFET structure 102B are formed of a semiconductor material having the same doping (e.g., P-type or N-type). The lower FETs 106A, 106B are both formed of a semiconductor material having a doping of a second type (e.g., N-type or P-type), which is opposite to the first type. In other words, if the upper FETs 104A, 104B are PFETs, the lower FETs 106A, 106B are NFETs, and vice versa.

A gate 124A of the upper FET 104A in the first CFET structure 102A, for example, is coupled to a gate 126A of the lower FET 106A. Similarly, a gate 124B of the upper FET 104B in the second CFET structure 102B is coupled to a gate 126B of the lower FET 106B. In this configuration, a first input signal IN-1 received on contact 120(3) is coupled to both of the gates 124A and 126A. The first input signal IN-1 can provide a supply voltage $V_{DD}$ that will turn on one of the upper FET 104A and the lower FET 106A, which is an N-type FET while turning off the other one of the upper FET 104A and the lower FET 106A, which is a P-type FET. The first input signal IN-1 can alternatively provide a reference voltage $V_{SS}$ (e.g., ground or 0V) that turns on one of the upper FET 104A and the lower FET 106A, which is a P-type FET while turning off the other one (e.g., that is an N-type FET). A second input signal IN-2 received on contact 120(5) is coupled to the gates 124B and 126B and can provide the supply voltage $V_{DD}$ or the reference voltage $V_{SS}$ to control the operation of (e.g., turn on and turn off) the upper FET 104B and the lower FET 106B.

As noted, the first input signal IN-1 and the second input signal IN-2 may be received from an external circuit at contact 120(3) and contact 120(5), respectively. The interconnect layer 112 also includes output contacts 120(1) and 120(6), which are coupled to each other by an external interconnect 128. The monolithic 3D CFET circuit 100 generates an output signal OUT on one of the output contacts 120(1) and 120(6) and may be provided to an external circuit (not shown) by the external interconnect 128. The state of the output signal OUT is based on a logical operation of the input signals IN-1 and IN-2. The upper FETs 104A, 104B, and lower FETs 106A, 106B are interconnected as a digital logic circuit to perform a binary Not-AND (NAND) operation. In a binary operation, a first voltage (e.g., $V_{SS}$) may correspond to a "0," and a second voltage (e.g., $V_{DD}$) may correspond to a "1". In the NAND operation, the output signal OUT is generated at the voltage (e.g., $V_{SS}$) corresponding to a "0" state only in response to the first input signal IN-1 and the second input signal IN-2, both being at the voltage (e.g., $V_{DD}$) corresponding to a "1". Otherwise, the output signal OUT is at the "1" state. As understood in the art, the second voltage $V_{DD}$ may correspond to a "0," and the first voltage $V_{SS}$ may correspond to a "1" in some examples, which would also reverse the voltage of the output signal OUT in response to a "1" indicated by both of the input signal IN-1 and the input signal IN-2.

Structurally, the upper FET 104A may be similar to the lower FET 106A despite being a different type of FET. In addition, the structures of the upper FET 104B and the lower FET 106B are similar to the upper FET 104A and the lower FET 106A. Thus, a detailed explanation of the upper FET 104A provided below is also descriptive of the upper FET 104B, the lower FET 106A, and the lower FET 106B; no additional details of such FETs are provided, except as needed.

The upper FET 104A in this example is a gate-all-around (GAA) FET that includes semiconductor slabs 132(1), 132(2), and 132(3), referred to collectively as slabs 132, forming channel region 134A. The slabs 132 in P-type devices may include silicon (Si), silicon germanium (SiGe), germanium (Ge), gallium arsenide (GaAs), or compounds thereof, for example. For example, the slabs 132 in N-type devices may include Si, GaAs, or compounds thereof. As noted, the CFET structures 102A, 102B are disposed on an insulation layer 116 and a semiconductor substrate 118. The CFETS 104A, 104B, 106A, and 106B are formed as bulk-type transistors on the semiconductor substrate 118.

On a first side SA1 of the first CFET structure 102A, a first source/drain SD1-UA1 is coupled to a first end of the slabs 132, and a second source/drain SD1-UA2 is coupled to a second end of the slabs 132 on a second side SA2 of the first CFET structure 102A. The first and second source/drains SD1-UA1, SD1-UA2 may be epitaxially grown on the semiconductor material of the slabs 132. A direction of current through the channel region 134A would be in a direction of the X-axis in FIG. 1 and may be left to right or right to left, depending on a voltage applied between source/drains SD1-UA1, SD1-UA2, which will determine which of the source/drains SD1-UM, SD1-UA2 functions as a source and which functions as a drain.

A source/drain SD1-UB1 is on a first side SB1 of the second CFET structure 102B, and a source/drain SD1-UB2 is on a second side SB2 of the second CFET structure 102B. The source/drains SD1-UB1 and SD1-UB2 are coupled to opposite ends of a channel region 134B in the upper FET 104B. It is noted that the first sides SA1 of the CFET structure 102A and SB1 of the second CFET structure 102B are between the CFET structures 102A, 102B. The second sides SA2 and SB2, are outside (e.g., not between) the CFET structures 102A, 102B.

In the lower FET 106A, the source/drain SD1-LA1 is on the first side SA1, and the source/drain SD1-LA2 is on the second side SA2 of the second CFET structure 102B. In the lower FET 106B, the source/drain SD1-LB1 is on the first side SB1, and the source/drain SD1-LB2 is on the second side SB2.

The vias 114 coupled to the CFET structures 102A, 102B provide the monolithic 3D CFET circuit 100 access to external circuits and reduce a total area occupied by the monolithic 3D CFET circuit 100. The vias 114 extend in a Y-axis direction, which is a vertical direction, in FIG. 1. The vias 114 include vias 114(1)-114(12). The vias 114(2)-114(7) are also referred to here as upper vias because they connect the first and second CFET structures 102A, 102B to the interconnect layer 112.

The vias 114(1)-114(12) are described individually. The via 114(4) extends from the first source/drain SD1-UA1 of the upper FET 104A to the contact 120(4) in the interconnect layer 112 on the first side SA1 of the first CFET structure 102A. The via 114(5) extends from the first source/drain SD1-UB1 of the upper FET 104B to the contact 120(4) in the interconnect layer 112 on the first side SB1 of the second CFET structure 102B. The via 114(2) extends from the second source/drain SD1-UA2 of the upper FET 104A to the contact 120(2) on the second side SA2 of the first CFET structure 102A. The via 114(7) extends from the second source/drain SD1-UB2 of the upper FET 104B to the contact 120(6) on the second side SB2 of the second CFET structure 102B. The via 114(3) couples the gate 124A of the upper FET 104A and the gate 126A of the lower FET 106A to the interconnect layer 112. The via 114(6) couples the gate 124B of the upper FET 104B and the gate 126B of the lower FET 106B to the interconnect layer 112.

The first source/drain SD1-UA1 and the second source/drain SD1-UA2 of the upper FET 104A have a source/drain width dimension WSD1 in the X-axis direction. The first source/drain SD1-LA1 and the second source/drain SD1-LA2 also have the source/drain width WSD1. Thus, the first source/drain SD1-UA1 of the upper FET 104A is directly between the first source/drain SD1-LA1 of the lower FET 106A and the interconnect layer 112 in the Y-axis direction, thereby blocking the path of a via in the vertical direction from the first source/drain SD1-LA1 up to the interconnect layer 112.

To couple the first source/drain SD1-LA1 to the interconnect layer 112, the monolithic 3D CFET circuit 100 also includes via 114(10) extending from the first source/drain SD1-LA1 of the lower FET 106A to an interconnect 136(2) in a lower interconnect layer 138 on the first side SA1 of the first CFET structure 102A. The lower interconnect layer 138 is disposed below the semiconductor substrate 118 to provide horizontal (e.g., X-axis direction) interconnects 136(1)-136(3). The vias 114(1) and 114(8)-114(12) are referred to here as lower vias because they couple to the lower interconnect layer 138. Via 114(9) extends from the second source/drain SD1-LA2 of the lower FET 106A to an interconnect 136(1) in the lower interconnect layer 138 on the second side SA2 of the first CFET structure 102A. Via 114(11) extends from the first source/drain SD1-LB of the lower FET 106B to an interconnect 136(2) in the lower interconnect layer 138 on the first side SB1 of the second CFET structure 102B. Via 114(12) extends from the second source/drain SD1-LB2 of the lower FET 106B to an interconnect 136(3) in the lower interconnect layer 138 on the second side SB2 of the second CFET structure 102B.

The vias 114(9)-114(12) are needed to couple the source/drains SD1-LA1, SD1-LA2, SD1-LB1, and SD1-LB2 to the lower interconnect layer 138 because the source/drains SD1-LA1, SD1-LA2, SD1-LB1, and SD1-LB2 have the same width dimension WSD1 as the source/drains SD1-UA1, SD1-UA2, SD1-UB1, and SD1-UB2. The source/drains SD1-UA1, SD1-UA2, SD1-UB1, and SD1-UB2 block direct paths in the vertical direction for vias extending upward from the source/drains SD1-LA1, SD1-LA2, SD1-LB1, and SD1-LB2 to the interconnect layer 112.

As shown in FIG. 1, the interconnect 136(2) couples the first source/drain SD1-LA1 of the lower FET 106A to the first source/drain SD1-LB1 of the lower FET 106B through vias 114(10) and 114(11). The second source/drain SD1-LA2 of the lower FET 106A is coupled to contact 120(1) in the interconnect layer 112 through via 114(9), interconnect 136(1), and via 114(1). The second source/drain SD1-LB2 of the lower FET 106B is coupled to contact 120(8) in the interconnect layer 112 through via 114(12), interconnect 136(3), and via 114(8).

Operation of the monolithic 3D CFET circuit 100 as the NAND circuit is readily understood by persons of skill in the art with reference to schematic diagram 140 in FIG. 1. In this example, the upper FETs 104A, 104B are N-type FETs, the lower FETs 106A, 106B are P-type FETs, and the contacts 120(1)-120(6) are externally coupled, as shown in schematic diagram 140 and as detailed below.

A logical operation is provided by the monolithic 3D CFET circuit 100 by coupling an external circuit as follows. The input signal IN-1 is received on the contact 120(3). The input signal IN-2 is received on the contact 120(5). The output signal OUT is generated on the external interconnect 128 from one of the contact 120(1) and contact 120(8). Contact 120(2) is coupled to the reference voltage $V_{SS}$. The contact 120(4) couples the first source/drain SD1-UA1 of the upper FET 104A to the first source/drain SD1-UB1 of the upper FET 104B through vias 114(4) and 114(5). The interconnect 136(2) is coupled to the supply voltage $V_{DD}$. A binary "1" on each of the input signal IN-1 and the input signal IN-2 produces a binary "0" on the output signal OUT.

Figure 2:
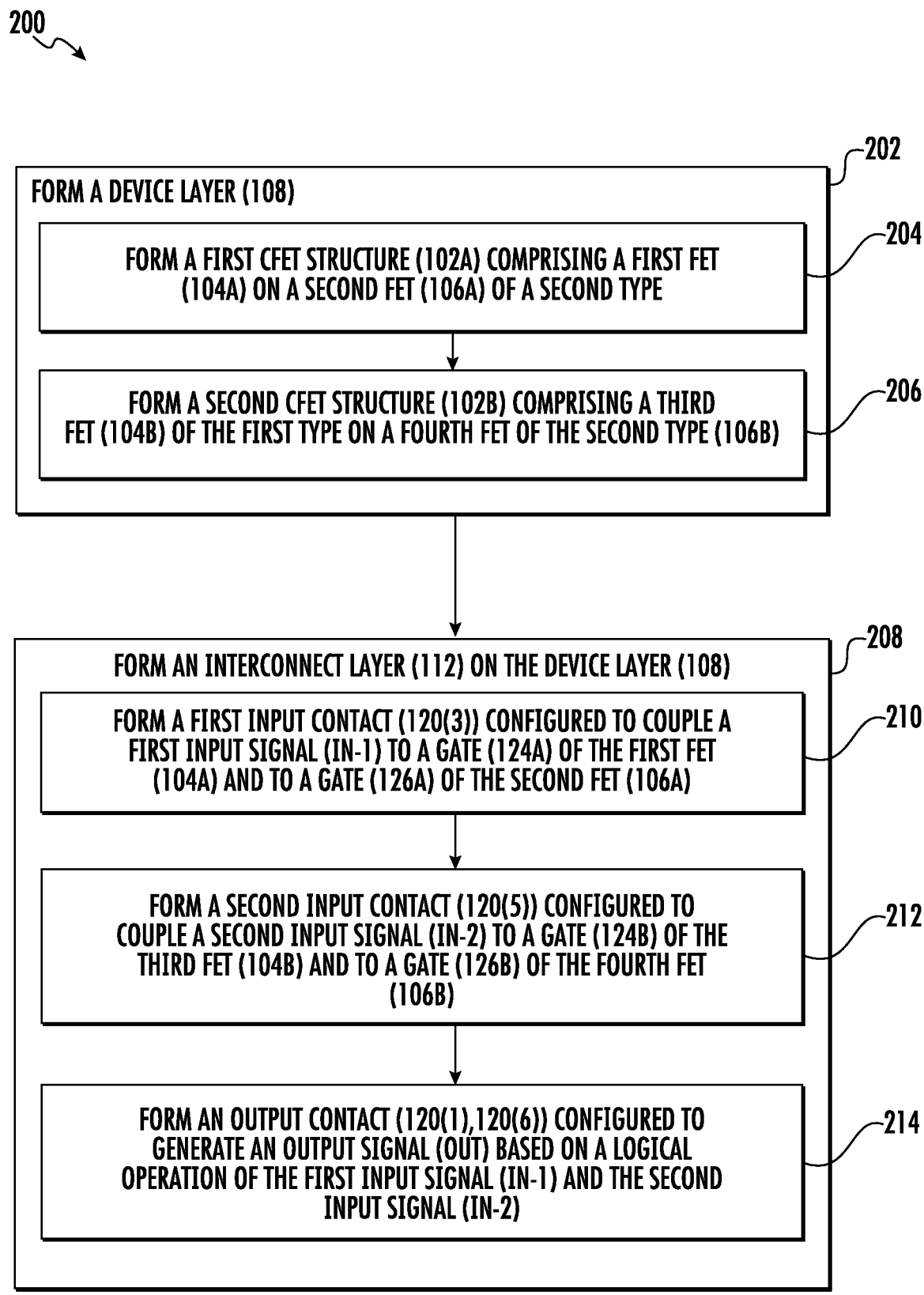
FIG. 2 is a flowchart of a method of fabricating the monolithic 3D CFET circuit in FIG. 1.

FIG. 2 is a flowchart of a method 200 of fabricating the monolithic 3D CFET circuit 100. The method includes forming a device layer 108 (block 202), comprising: forming a first CFET structure 102A comprising a first FET 104A of a first type on a second FET 106A of a second type (block 204), and forming a second CFET structure 102B comprising a third FET 104B of the first type on a fourth FET 106B of the second type (block 206). The method further includes forming an interconnect layer 112 on the device layer 108 (block 208), further comprising forming a first input contact 120(3) configured to couple a first input signal IN-1 to a gate 124A of the first FET 104A and to a gate 126A of the second FET 106A (block 210). Forming an interconnect layer 112 also includes forming a second input contact 120(5) configured to couple a second input signal IN-2 to a gate 124B of the third FET 104B and to a gate 126B of the fourth FET 106B (block 212); and forming an output contact 120(1), 120(6) configured to generate an output signal OUT based on a logical operation of the first input signal IN-1 and the second input signal IN-2 (block 214).

FIGS. 3-7 are cross-sectional side views of monolithic 3D CFET circuits 300-700, which are other examples of NAND circuits as disclosed herein. Each of the monolithic 3D CFET circuits 300-700 includes respective first and second CFET structures corresponding to and similar to the first and second CFET structures 102A and 102B in FIG. 1.

Figure 3:
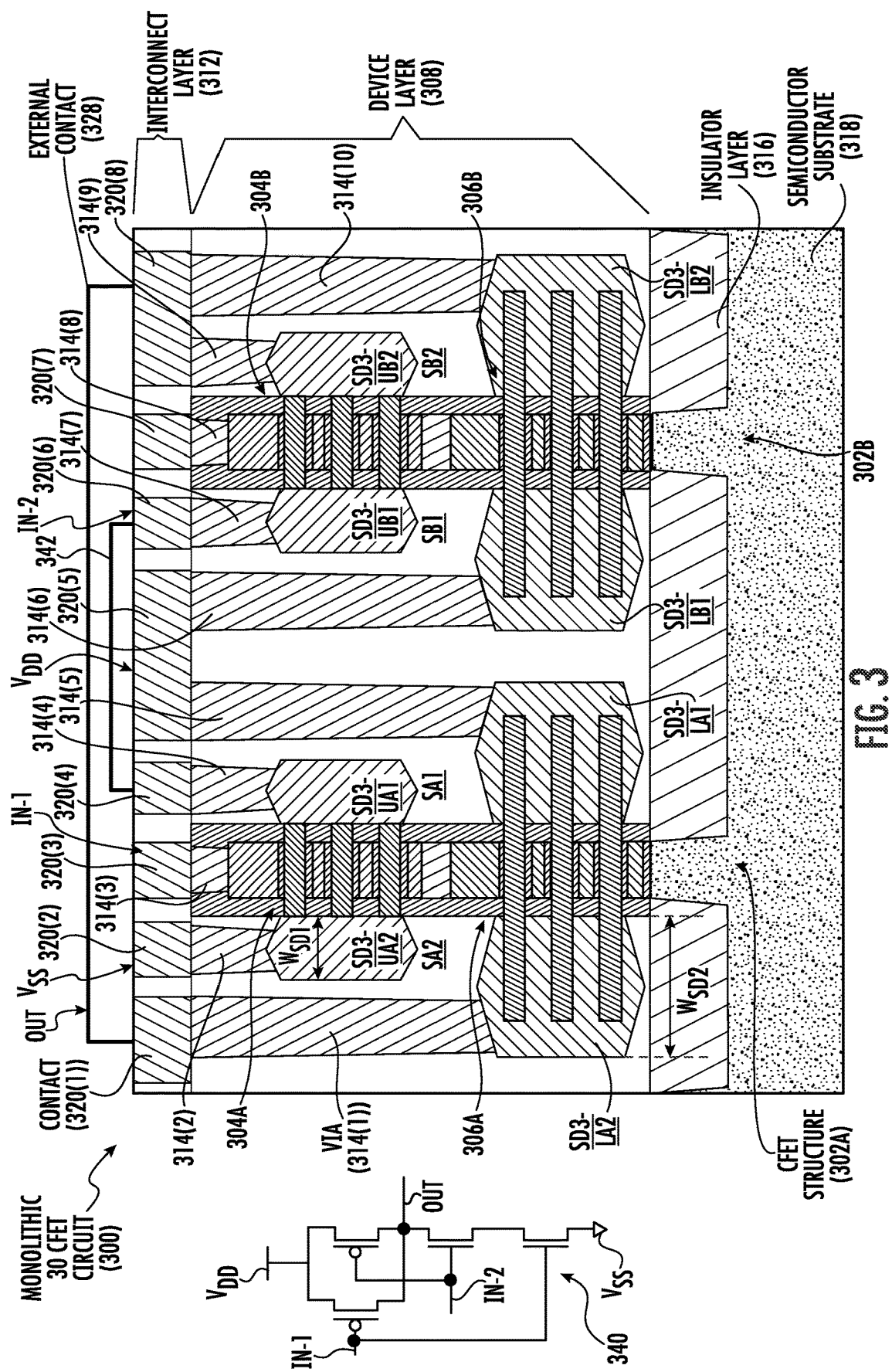
FIG. 3 is a cross-sectional side view of a monolithic 3D CFET circuit, including CFET structures formed on a semiconductor substrate in a second configuration of a NAND circuit.

FIG. 3 is a cross-sectional side view of the monolithic 3D CFET circuit 300, including first and second CFET structures 302A and 302B. The CFET structure 302A includes an upper FET 304A on a lower FET 306A, and the CFET structure 302B includes an upper FET 304B on a lower FET 306B. The upper FET 304A includes a first source/drain SD3-UA1 on a first side SA1 of the first CFET structure 302A and a second source/drain SD3-UA2 on a second side SA2 of the first CFET structure 302A. The lower FET 306A includes a first source/drain SD3-LA1 on a first side SA1 of the first CFET structure 302A and a second source/drain SD3-LA2 on a second side SA2 of the first CFET structure 302A. The first and second CFET structures 302A and 302B are formed in a device layer 308.

The upper FET 304B includes a first source/drain SD3-UB1 on a first side SB1 of the second CFET structure 302B and a second source/drain SD3-UB2 on a second side SB2 of the second CFET structure 302B. The lower FET 306B includes a first source/drain SD3-LB1 on the first side SB1 and a second source/drain SD3-LB2 on the second side SB2.

As in FIG. 1, the monolithic 3D CFET circuit 300 includes an interconnect layer 312, an insulator layer 316, and a semiconductor substrate 318. The upper FETs 304A, 304B, and the lower FETs 306A, 306B are formed as bulk-type transistors on the semiconductor substrate 318. The interconnect layer 312 includes contacts 320(1)-320(8). The NAND operation of the monolithic 3D CFET circuit 300 can be understood through an analysis of the schematic diagram 340, which corresponds to the schematic diagram 140.

The first and second source/drains SD3-UA1, SD3-UA2 of the CFET structure 302A, and the first and second source/drains SD3-UB1, SD3-UB2 of the CFET structure each has the first source/drain width WSD1 in the X-axis direction. Vias 314(2)-314(4) and 314(7)-314(9) of the monolithic 3D CFET circuit 300 correspond to vias 114(2)-114(7) of FIG. 1. In this regard, the vias 314(2)-314(4) and 314(7)-314(9) may be referred to as upper vias. The upper vias between the FETs 304A, 304B, and the interconnect layer 312 are similar to or the same as the upper vias 114 in FIG. 1 between the upper FETs 104A, 104B, and the interconnect layer 112.

However, unlike the monolithic 3D CFET circuit 100, in the monolithic 3D CFET circuit 300, the first and second source/drains SD3-LA1, SD3-LA2 of the lower FET 306A, and the first and second source/drains SD3-LB1, SD3-LB2 of the lower FET 306B have a source/drain width dimension WSD2 that is greater in the X-axis direction than the source/drain width dimension WSD1. Consequently, the first source/drain SD3-LA1, for example, extends farther in the X-axis direction away from the lower FET 306A on the first side SA1 than the first source/drain SD3-UA1, and the second source/drain SD3-LA2 extends farther in the X-axis direction away from the lower FET 306A on the second side SA2 than the second source/drain SD3-UA2. Thus, the first source/drain SD3-UA1 of the upper FET 304A is not disposed between, in the Y-axis direction, a portion of the first source/drain SD3-LA1 the interconnect layer 312, and the second source/drain SD3-UA2 of the upper FET 304A is not disposed between, in the Y-axis direction, a portion of the second source/drain SD3-LA2 and the interconnect layer 312. Consequently, some of the vias 314 can extend unobstructed in the Y-axis direction to couple the first and second source/drains SD3-LA1, SD3-LA2, and SD3-LB1, SD3-LB2 of the lower FETs 306A, 306B to the interconnect layer 312. Since the first and second source/drains SD3-UA1, SD3-UA2, and SD3-UB1, SD3-UB2 do not obstruct a via path in the Y-axis direction, a second interconnect layer (such as interconnect layer 138 in FIG. 1) is not needed to provide an offset in the X-axis direction, and the total number of the vias 314 is reduced compared to FIG. 1, which further reduces the total area occupied by the monolithic 3D CFET circuit 300.

The CFET structures 302A and 302B are coupled to the interconnect layer 312 as follows. The via 314(1) couples the contact 320(1) to the second source/drain SD3-LA2 of the lower FET 306A. Via 314(2) is coupled between contact 320(2) and the second source/drain SD3-UA2 of the upper FET 304A. Via 314(3) couples contact 320(3) to gate 324A of the upper FET 304A and to gate 326A of the lower FET 306A. Via 314(4) couples contact 320(4) to the first source/drain SD3-UA1 of the upper FET 304. Contact 320(5) is coupled to the first source/drain SD3-LA1 of the lower FET 306A by the via 314(5). Contact 320(5) is also coupled to the first source/drain SD3-LB1 of the lower FET 306B by the via 314(6). Thus, the via 314(5), the contact 320(5), and the via 314(6) couple the first source/drain SD3-LA1 of the lower FET 306A to the first source/drain SD3-LB1 of the lower FET 306B.

Via 314(7) couples contact 320(6) to the first source/drain SD3-UB1 of the upper FET 304B. An external interconnect 342 couples contact 320(4) to contact 320(6) to couple the first source/drain SD3-UA1 of the upper FET 304A to the first source/drain SD3-UB1 of the upper FET 304B. Via 314(8) couples contact 320(7) to gate 324B of the upper FET 304B and to gate 326B of the lower FET 306B. Contact 320(8) is coupled to the second source/drain SD3-UB2 of the upper FET 304B by the via 314(9). Contact 320(8) is also coupled to the second source/drain SD3-LB2 of the lower FET 306B. Thus, the via 314(9), the contact 320(8), and the via 314(10) couple the second source/drain SD3-UB1 of the upper FET 304B to the second source/drain SD3-LB2 of the lower FET 306B.

For operation as a NAND logic circuit, the first input signal IN-1 is received from an external circuit on contact 320(3), and the second input signal IN-2 is received on contact 320(7). External interconnect 328 couples the contact 320(1) to the contact 320(8) and provides a connection on which the output signal OUT may be connected to an external circuit. Contact 320(2) receives a reference voltage $V_{SS}$ (e.g., ground, 0 volts), and contact 320(5) receives the supply voltage $V_{DD}$ to power the NAND logic circuit.

Figure 4:
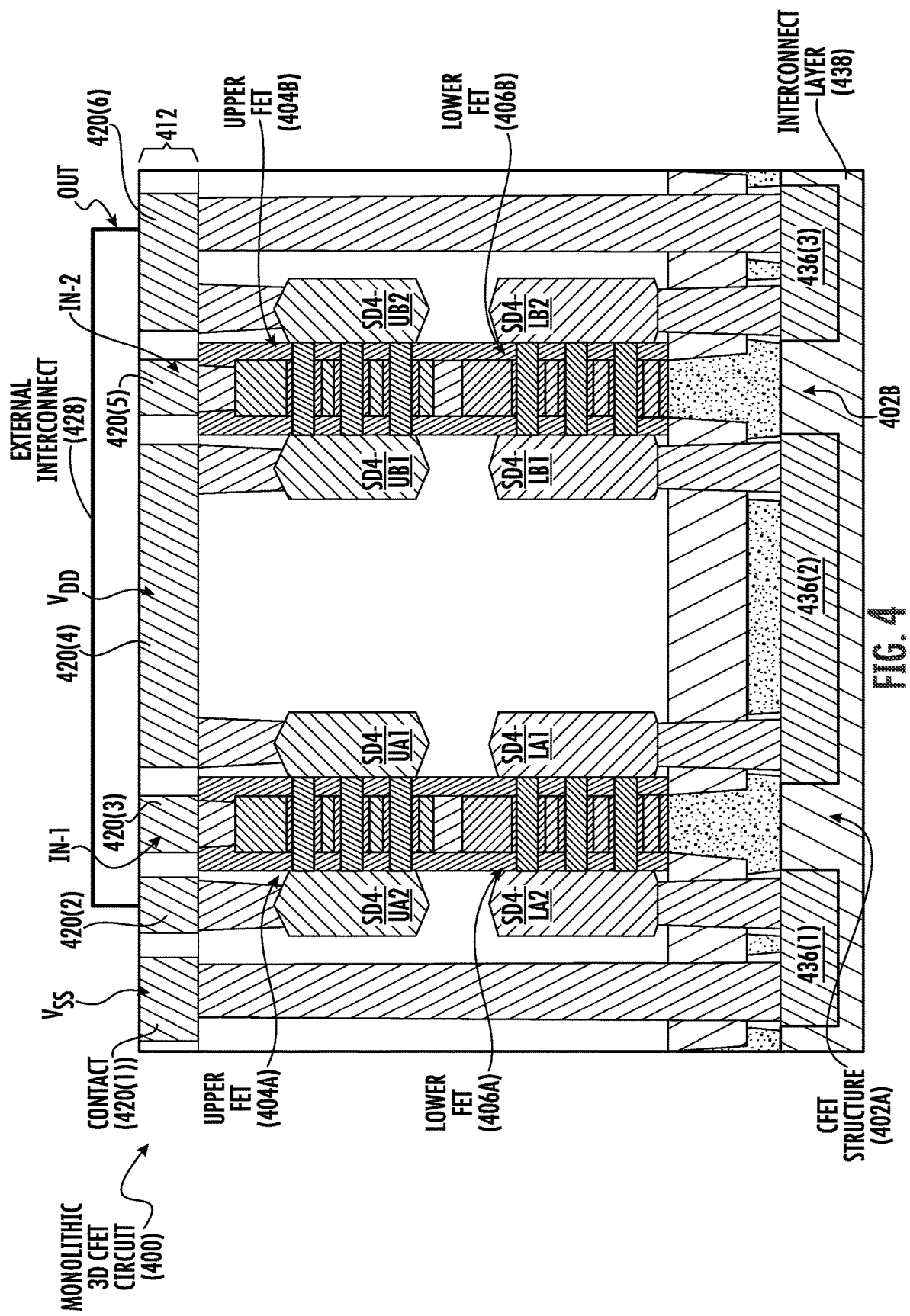
FIG. 4 is a cross-sectional side view of a monolithic 3D CFET circuit, including CFET structures formed on a semiconductor substrate in a third configuration of a NAND circuit.

FIG. 4 is a cross-sectional side view of a monolithic 3D CFET circuit 400 in another example of a NAND logic circuit. The monolithic 3D CFET circuit 400 is structurally the same as the monolithic 3D CFET circuit 100 in FIG. 1, except as indicated below.

The monolithic 3D CFET circuit 400 includes CFET structures 402A and 402B, with upper FETs 404A and 404B being a first type of FET and lower FETs 406B being a second type of FET, as in FIG. 1. However, the configuration in FIG. 1 is based on the upper FETs 104A, 104B being N-type FETs and the lower FETs 106A, 106B being P-type FETs. In the configuration in FIG. 4, the upper FETs 404A, 404B are P-type FETs, and the lower FETs 406A, 406B are N-type FETs. In accordance with this difference, the monolithic 3D CFET circuit 400 is configured as a NAND logic circuit in the following manner.

The monolithic 3D CFET circuit 400 includes contacts 420(1)-420(6) in an interconnect layer 412 and interconnects 436(1)-436(3) in an interconnect layer 438. Instead of the external interconnect 128 in FIG. 1, an external interconnect 428 couples contact 420(2) and 420(6) to electrically couple a second source/drain SD4-UA2 of the upper FET 404A with a second source/drain SD4-UB2 of the upper FET 404B and the second source/drain SD4-LB2 of the lower FET 406B. The output signal OUT is generated on the external interconnect 428 for provision to an external circuit, not shown. The reference voltage $V_{SS}$ is supplied to contact 420(1). The first input signal IN-1 and the second input signal IN-2 are received at the contacts 420(3) and 420(5), respectively. The power supply voltage $V_{DD}$ is received at contact 420(4).

Figure 5:
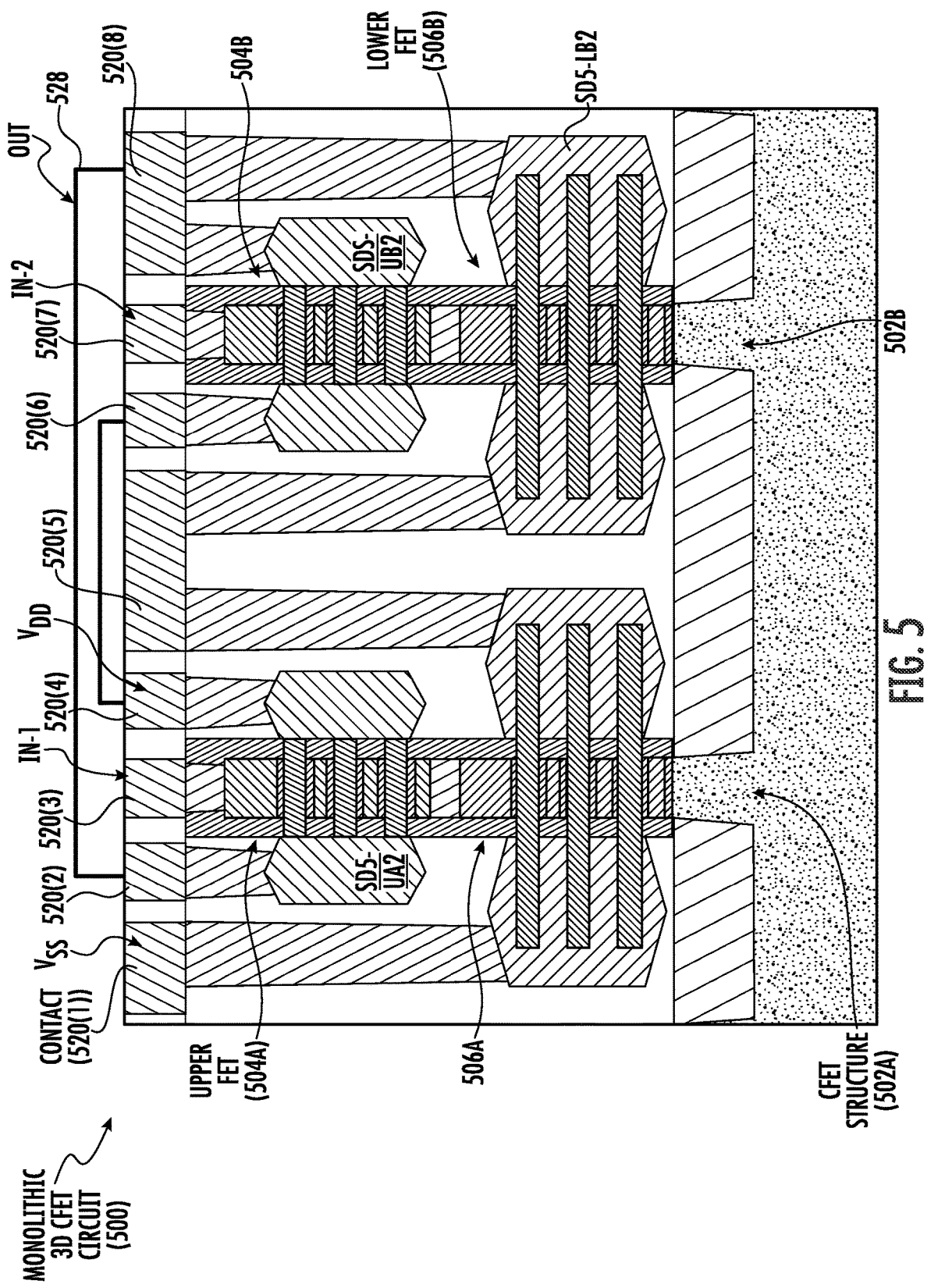
FIG. 5 is a cross-sectional side view of a monolithic 3D CFET circuit, including CFET structures formed on a semiconductor substrate in a fourth configuration of a NAND circuit.

FIG. 5 is a cross-sectional side view of a monolithic 3D CFET circuit 500 in another example of a NAND logic circuit. The monolithic 3D CFET circuit 500 is structurally the same as the monolithic 3D CFET circuit 300 in FIG. 3, except that the CFET structures 502A and 502B have upper FETs 504A, 504B that are P-type FETs disposed on the lower FETs 506A, 506B, which are N-type FETs, which is opposite to the configuration in FIG. 3.

The monolithic 3D CFET circuit 500 includes contacts 520(1)-520(8) in an interconnect layer 512. An external interconnect 528 couples contact 520(2) and 520(8) to electrically couple a second source/drain SD5-UA2 of the upper FET 504A with a second source/drain SD5-UB2 of the upper FET 504B and also with a second source/drain SD5-LB2 of the lower FET 506B. The output signal OUT is generated on the external interconnect 528 for provision to an external circuit, not shown. The reference voltage $V_{SS}$ is supplied to contact 520(1). The first input signal IN-1 and the second input signal IN-2 are received at the contacts 520(3) and 520(7), respectively. The power supply voltage $V_{DD}$ is received at contact 520(4). A second external interconnect 542 couples contact 520(4) and contact 520(6).

Contact 520(5) couples the first source/drain SD5-LA1 of the lower FET 506A and the first source/drain SD5-LB1 of the lower FET 506B.

Figure 6:
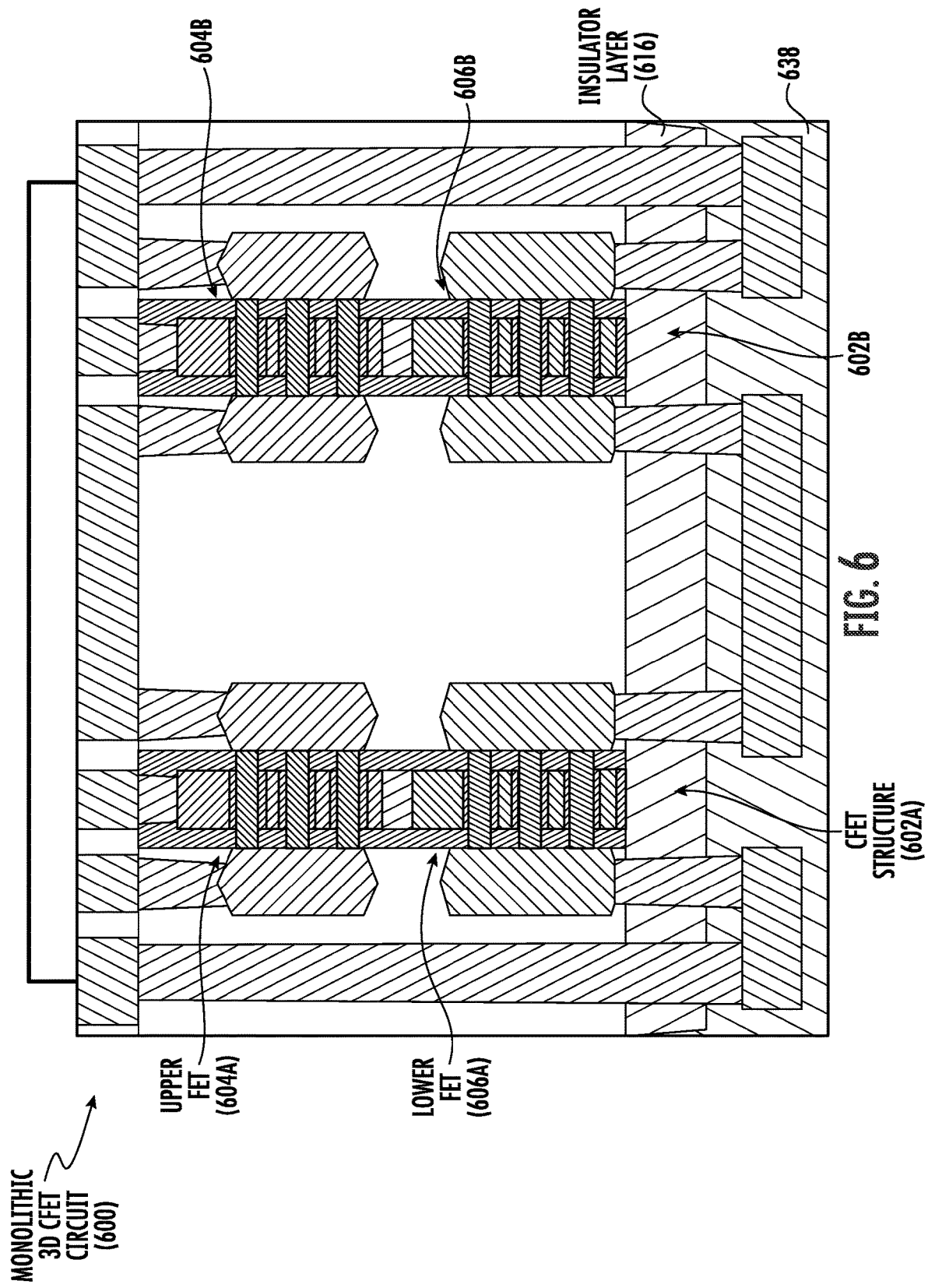
FIG. 6 is a cross-sectional side view of a monolithic 3D CFET circuit, including CFET structures formed on an insulator layer in a fifth configuration of a NAND circuit.
Figure 7:
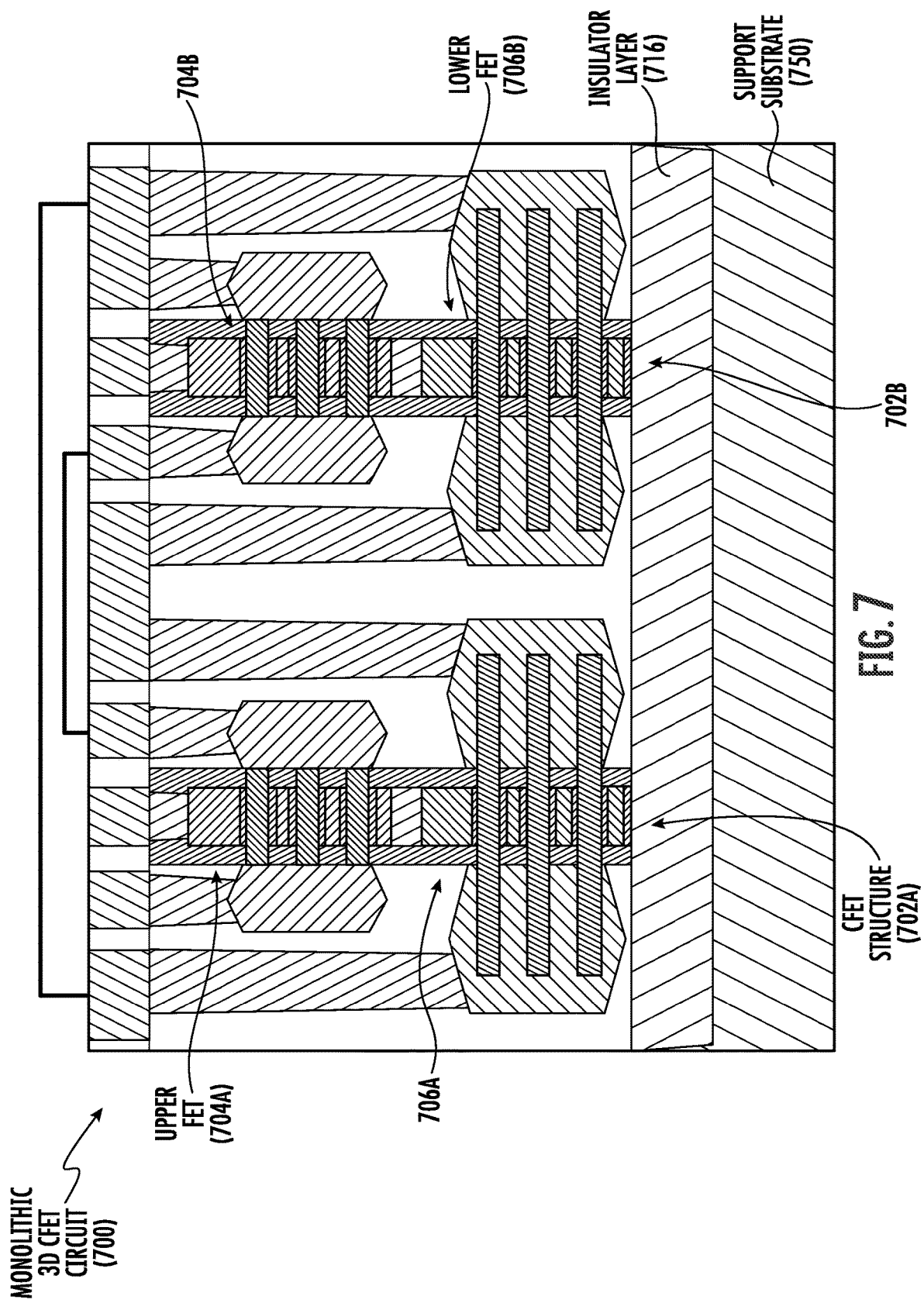
FIG. 7 is a cross-sectional side view of a monolithic 3D CFET circuit, including CFET structures formed on an insulator layer in a sixth configuration of a NAND circuit.

FIGS. 6 and 7 are cross-sectional side views of monolithic 3D CFET circuits 600 and 700, respectively, each is an example of NAND logic circuits. The structures of the monolithic 3D CFET circuits 600 and 700 and external interconnections for configuring operation as a NAND logic circuit are identical to the structures of the monolithic 3D CFET circuits 100 and 300, except that the monolithic 3D CFET circuits 600 and 700 do not include a semiconductor substrate. Instead, the monolithic 3D CFET circuits 600 and 700 are formed on insulator substrates.

In detail, the monolithic 3D CFET circuit 600 includes CFET structures 602A, 602B with upper FETs 604A, 604B disposed above lower FETs 606A, 606B. The monolithic 3D CFET circuit 700 includes CFET structures 702A, 702B with upper FETs 704A, 704B disposed above and lower FETs 706A, 706B. The FETs in the CFET structures 602A, 602B, and CFET structures 702A, 702B are formed on insulator layers 616 and 716, respectively, as silicon-on-insulator (SOI) transistors. The monolithic 3D CFET circuit 600 includes an interconnect layer 638, which may provide additional structural support for the insulator layer 616. The insulator layer 716 may be disposed on a support substrate 750.

Although not depicted here, the monolithic 3D CFET circuits 400 and 500, in which PFETs are disposed on NFETs in the respective CFET structures, may alternatively be fabricated on insulator layers with SOI transistors, as in the examples in FIGS. 6 and 7.

It should be noted that the dimensions of the features illustrated in FIGS. 1 and 3-13 are not to scale.

FIGS. 8-13 are cross-sectional side views of monolithic 3D CFET circuits 800-1300, which are structures whose features are identical to the monolithic 3D CFET circuits 100 and 300-700 shown in FIGS. 1 and 3-7, respectively. However, the monolithic 3D CFET circuits 800-1300 are configured by external interconnects and contacts to function as Not-OR (NOR) logic circuits, as follows.

Figure 8:
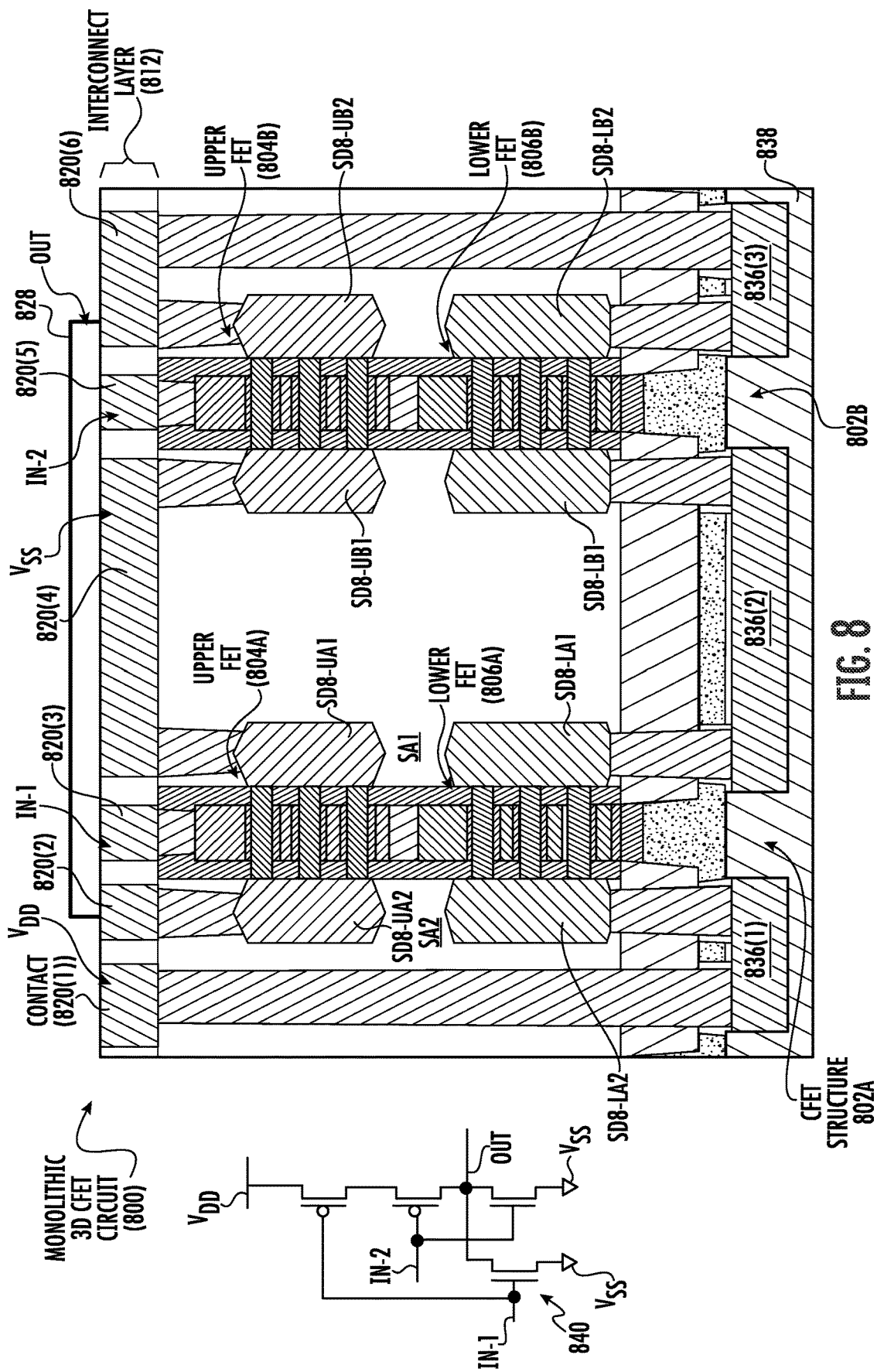
FIG. 8 is a cross-sectional side view of a monolithic 3D CFET circuit, including CFET structures formed on a semiconductor substrate in a first configuration of a NOR circuit.

The monolithic 3D CFET circuit 800 in FIG. 8 is structurally the same as the monolithic 3D CFET circuit 100 in FIG. 1 in a comparison of the device layer 108 and interconnect layers 112 and 138 in FIG. 1 to the device layer 808 and interconnect layers 812 and 838 in FIG. 8. The monolithic 3D CFET circuit 800 includes CFET structures 802A, 802B with upper FETs 804A, 804B of a first type disposed on (e.g., above) lower FETs 806A and 806B of a second type, respectively. The upper FET 804 includes a first source/drain SD8-UA1 on a first side SA1 of the CFET structure 802A and a second source/drain SD8_UA2 on a second side SA2 of the CFET structure 802A. The upper FET 804B and the lower FETs 806A and 806B also have first and second source/drains in accordance with FIG. 1.

The monolithic 3D CFET circuit 800 is configured as a NOR logic circuit, as shown in the schematic 840, as follows. The interconnect layer 812 includes contacts 820(1)-820(6), and the interconnect layer 838 includes interconnects 836(1)-836(3). Contact 820(1) receives the power supply voltage $V_{DD}$, which is coupled to a second source/drain SD8-LA2 of the lower FET 806A.

The contact 820(2) is coupled to the contact 820(6) by an external interconnect 828 on which the output signal OUT may be generated to an external circuit. In this manner, the external interconnect 828 is coupled to the second source/drain SD8-UA2 of the upper FET 804A, the second source/drain SD8-UB2 of the upper FET 804B, and the second source/drain SD8-LB2 of the lower FET 806B. The output signal OUT is based on the input signals IN-1 and IN-2. The first input signal IN-1 is received at contact 820(3), and the second input signal IN-2 is received at contact 820(5). The contact 820(4) couples the first source/drain SD8-UA1 of the upper FET 804A to the first source/drain SD8-UB1 of the upper FET 804B. Contact 820(4) is coupled to a ground to receive a reference voltage ($V_{SS}$). The interconnect 836(2) couples the first source/drain SD8-LA1 of the lower FET 806A to the first source/drain SD8-LB1 of the lower FET 806B.

Figure 9:
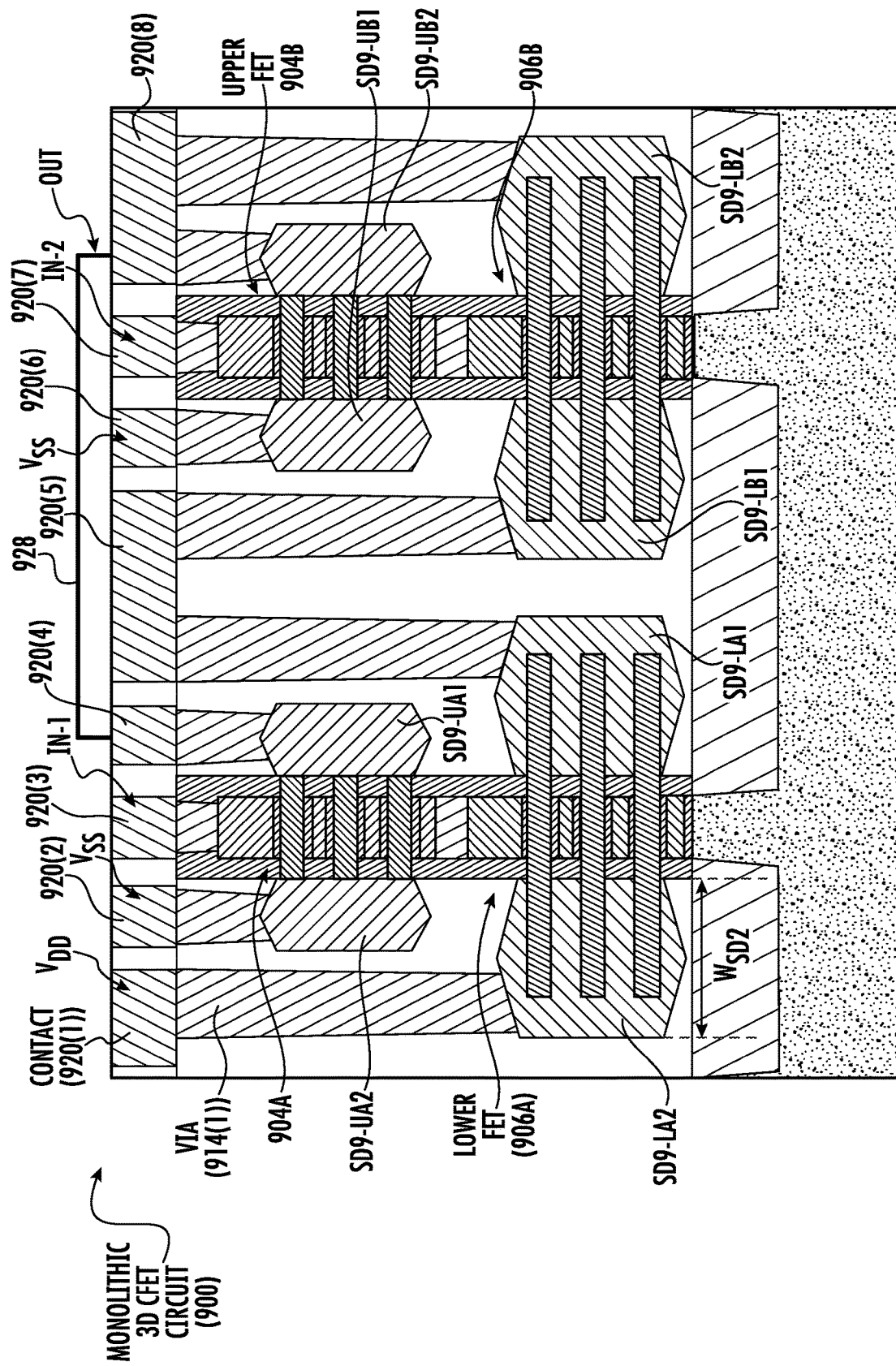
FIG. 9 is a cross-sectional side view of a monolithic 3D CFET circuit, including CFET structures formed on a semiconductor substrate in a second configuration of a NOR circuit.

FIG. 9 is a cross-sectional side view of the monolithic 3D CFET circuit 900 with the same structure as the monolithic 3D CFET circuit 300 but configured externally to function as a NOR logic circuit, as follows.

A contact 920(1) receives the power supply voltage $V_{DD}$, which is provided to a second source/drain SD9-LA2 of the lower FET 906A. The second source/drain SD9-LA2 has the greater source/drain width $W_{SD2}$ and, therefore, couples directly to the contact 920(1) by a via 914(1). Contact 920(2) receives the reference voltage $V_{SS}$, which is provided to the second source/drain SD9-UA2 of the upper FET 904A. The reference voltage $V_{SS}$ is also received at contact 920(6) and provided to the first source/drain SD9-UB1 of the upper FET 904B. Contact 920(3) receives the first input signal IN-1 to control the upper FET 904A and the lower FET 906A. The contact 920(7) receives the second input signal IN-2 to control the upper FET 904B and the lower FET 906B.

Contact 920(4) is coupled to contact 920(8) by an external interconnect 928, which may also provide the output signal OUT to external circuits. The contact 920(4) is coupled to the first source/drain SD9-UA1 of the upper FET 904A. The contact 920(7) is coupled to the second source/drain SD9-UB2 of the upper FET 904B and to the second source/drain SD9-LB2 of the lower FET 906B. Contact 920(5) is coupled to the first source/drain SD9-LA1 of the lower FET 906A and the first source/drain SD9-LB1 of the lower FET 906B.

Figure 10:
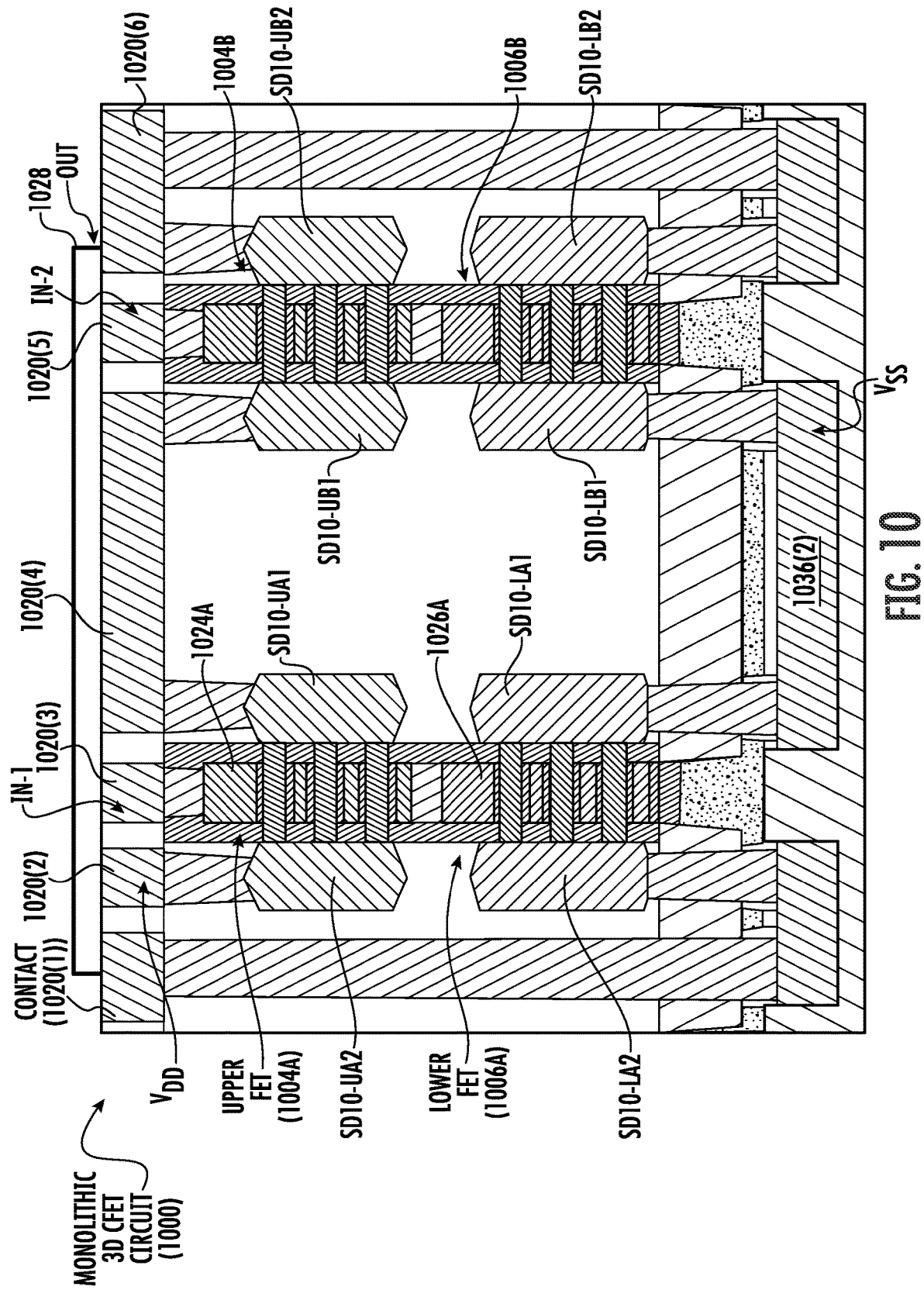
FIG. 10 is a cross-sectional side view of a monolithic CFET circuit, including CFET structures formed on a semiconductor substrate in a third configuration of a NOR circuit.

FIG. 10 is a cross-sectional side view of a monolithic 3D CFET circuit 1000, which is structurally the same as the monolithic 3D CFET circuit 400 but configured externally to function as a NOR logic circuit. The monolithic 3D CFET circuit 1000 is also structurally similar to the monolithic 3D CFET circuit 800, except that, in the monolithic 3D CFET circuit 1000, upper FETs 1004A and 1004B are P-type FETs and lower FETs 1006A and 1006B are N-type FETs.

Configuration to function as a NOR logic circuit includes the following. Contact 1020(1) is coupled to contact 1020(6) and may provide the output signal OUT to external circuits. Contact 1020(1) is coupled to the second source/drain SD10-LB2 of the lower FET 1006A. Contact 1020(6) is coupled to the second source/drain SD10-UB2 of the upper FET 1004B and the second source/drain SD10-LB2 of the lower FET 1006B. Contact 1020(2) receives the power supply voltage $V_{DD}$, which is provided to the second source/drain SD10-UA2 of the upper FET 1004A.

Contact 1020(3) receives the first input signal IN-1, which is provided to gates 1024A, 1026A of the CFET structure 1002A to control the upper FET 1004A and the lower FET 1006A. Contact 1020(5) receives the second input signal IN-2, which is provided to gates 1024B, 1026B of the CFET structure 1002B to control the upper FET 1004B and the lower FET 1006B. Contact 1020(4) is coupled to the first source/drain SD10-UA1 of the upper FET 1004A and to the first source/drain SD10-UB1 of the upper FET 1004B. The first source/drain SD10-LA1 of the lower FET 1006A is coupled to the first source/drain SD10-LB1 of the lower FET 1006B by interconnect 1036(2).

Figure 11:
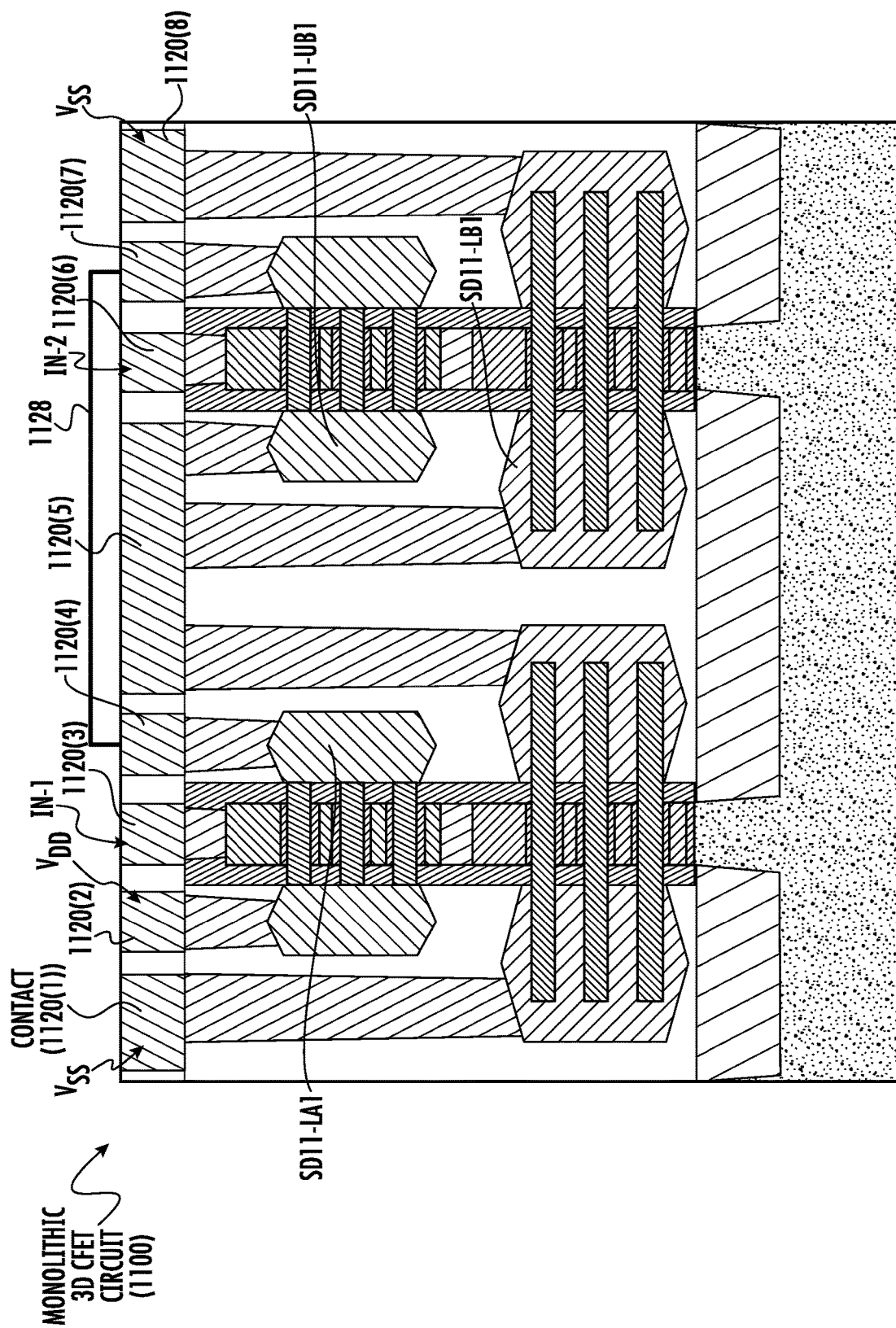
FIG. 11 is a cross-sectional side view of a monolithic 3D CFET circuit, including CFET structures formed on a semiconductor substrate in a fourth configuration of a NOR circuit.

FIG. 11 is a cross-sectional view of a monolithic 3D CFET circuit 1100 that is structurally the same as the monolithic 3D CFET circuit 500 and externally configured to function as a NOR logic circuit. Contact 1120(1) and contact 1120(8) receive the reference voltage $V_{SS}$. Contact 1120(2) receives the power supply voltage $V_{DD}$. The first input signal IN-1 is received at contact 1120(3), and the second input signal IN-2 is received at contact 1120(6). Contact 1120(4) is coupled to contact 1120(7) by an external interconnect 1128. Contact 1120(5) couples the first source/drain SD11-LA1, the first source/drain SD11-UB1, and the first source/drain SD11-LB1.

Figure 12:
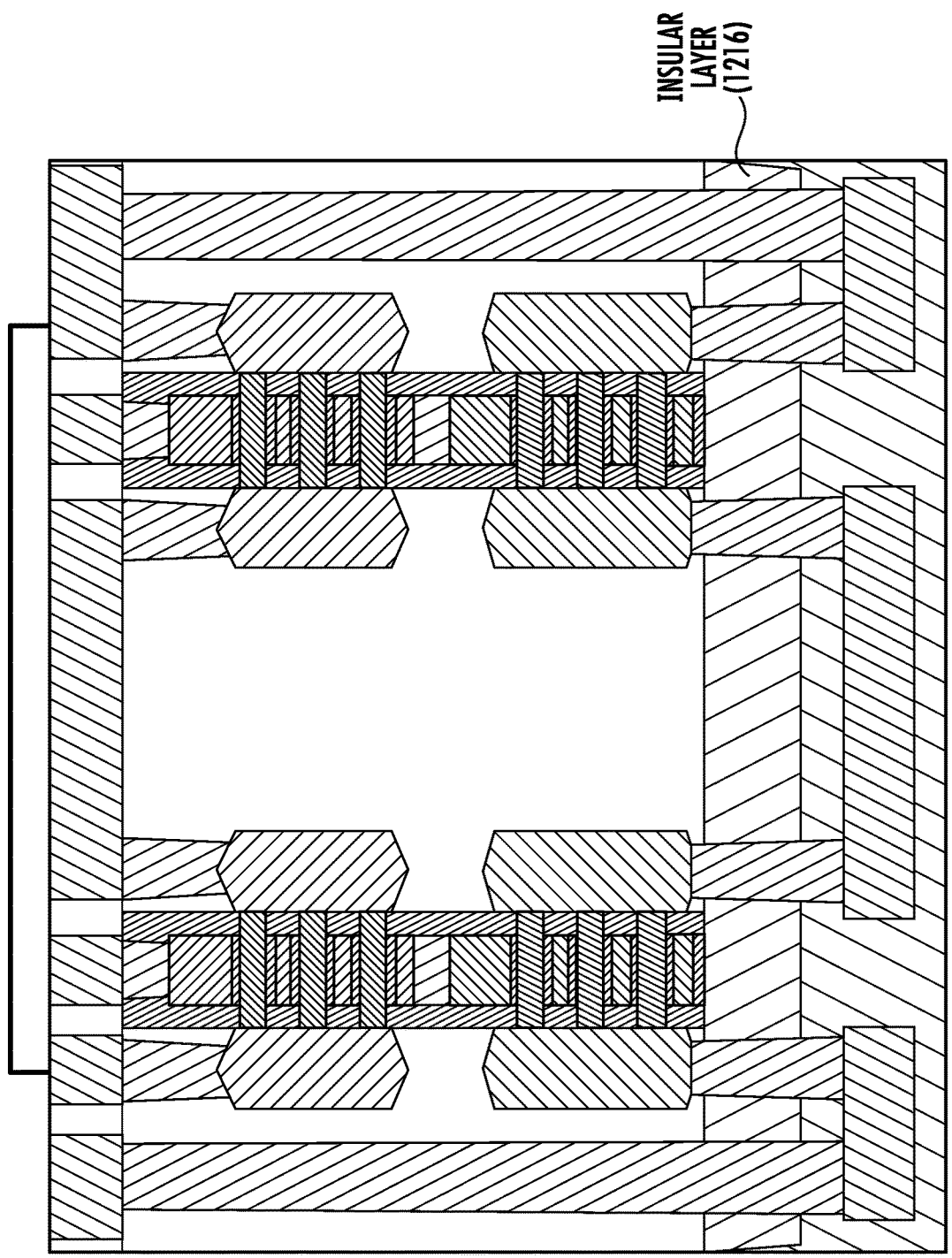
FIG. 12 is a cross-sectional side view of a monolithic 3D CFET circuit, including CFET structures formed on an insulator layer in a fifth configuration of a NOR circuit.
Figure 13:
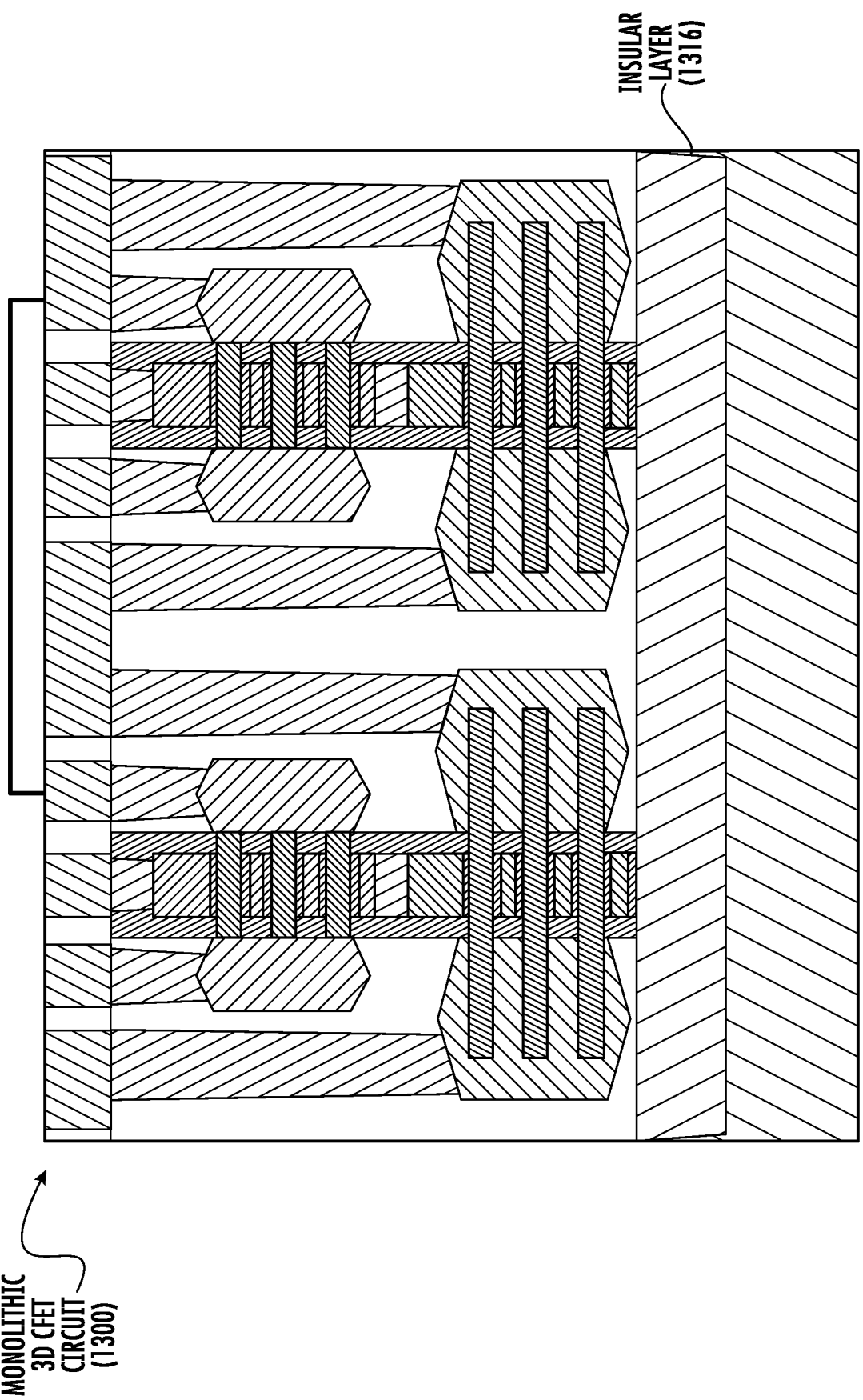
FIG. 13 is a cross-sectional side view of a monolithic 3D CFET circuit, including CFET structures formed on an insulator layer in a sixth configuration of a NOR circuit.

Each of the monolithic 3D CFET circuits is formed with bulk-type transistors on semiconductor substrates. The monolithic 3D CFET circuits 1200 and 1300 in FIGS. 12 and 13 are the same in all aspects as the monolithic 3D CFET circuits 800 and 900 in FIGS. 8 and 9, except that the monolithic 3D CFET circuits 1200 and 1300 are formed on insulator layers 1216 and 1316, respectively, with SOI transistors. Alternatively, the monolithic 3D CFET circuits 1000 and 1100 may also be formed with SOI transistors on insulator layers, but such examples are not shown here.

According to aspects disclosed herein, the monolithic 3D CFET circuit may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
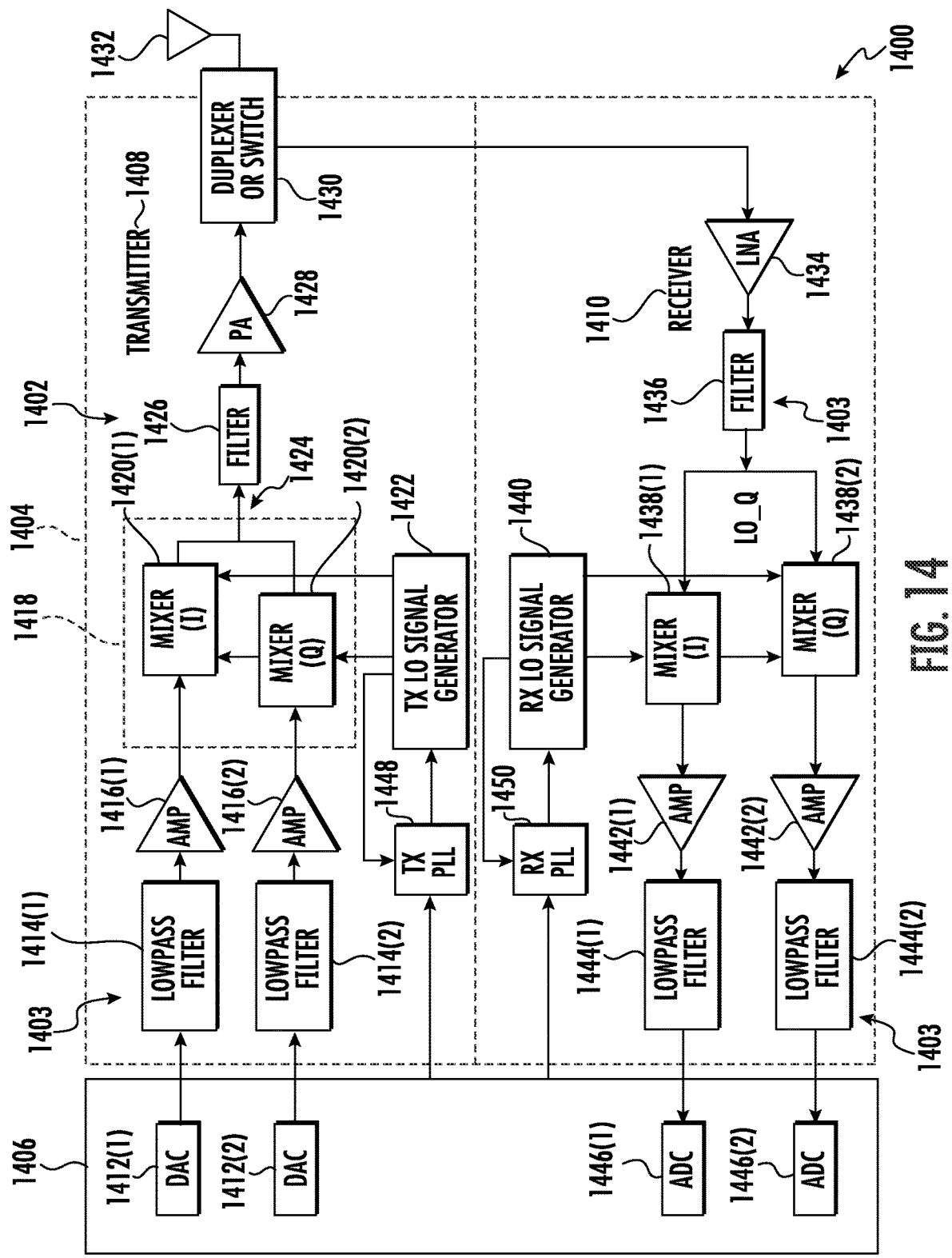
FIG. 14 is a block diagram of an exemplary wireless communications device that can include the monolithic 3D CFET circuit of any of FIG. 1 and FIGS. 3-13.

FIG. 14 illustrates an exemplary wireless communications device 1400 that includes radio-frequency (RF) components formed from one or more integrated circuits (ICs) 1402, which can include an exemplary monolithic 3D CFET circuit including CFET structures with upper FETs of a first type above lower FETs of a second type and configured as either NAND or NOR circuits, as illustrated in FIGS. 1 and 2-13, and according to any of the aspects disclosed herein. The wireless communications device 1400 may include or be provided in any of the above-referenced devices as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RFICs, mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals from a TX LO signal generator 1422 through mixers 1420(1), 1420(2) to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 830 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Downconversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Wireless communications devices 1400 can include an exemplary monolithic 3D CFET circuit including CFET structures with upper FETs of a first type above lower FETs of a second type and configured as either NAND or NOR circuits, as illustrated in FIGS. 1 and 2-13, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
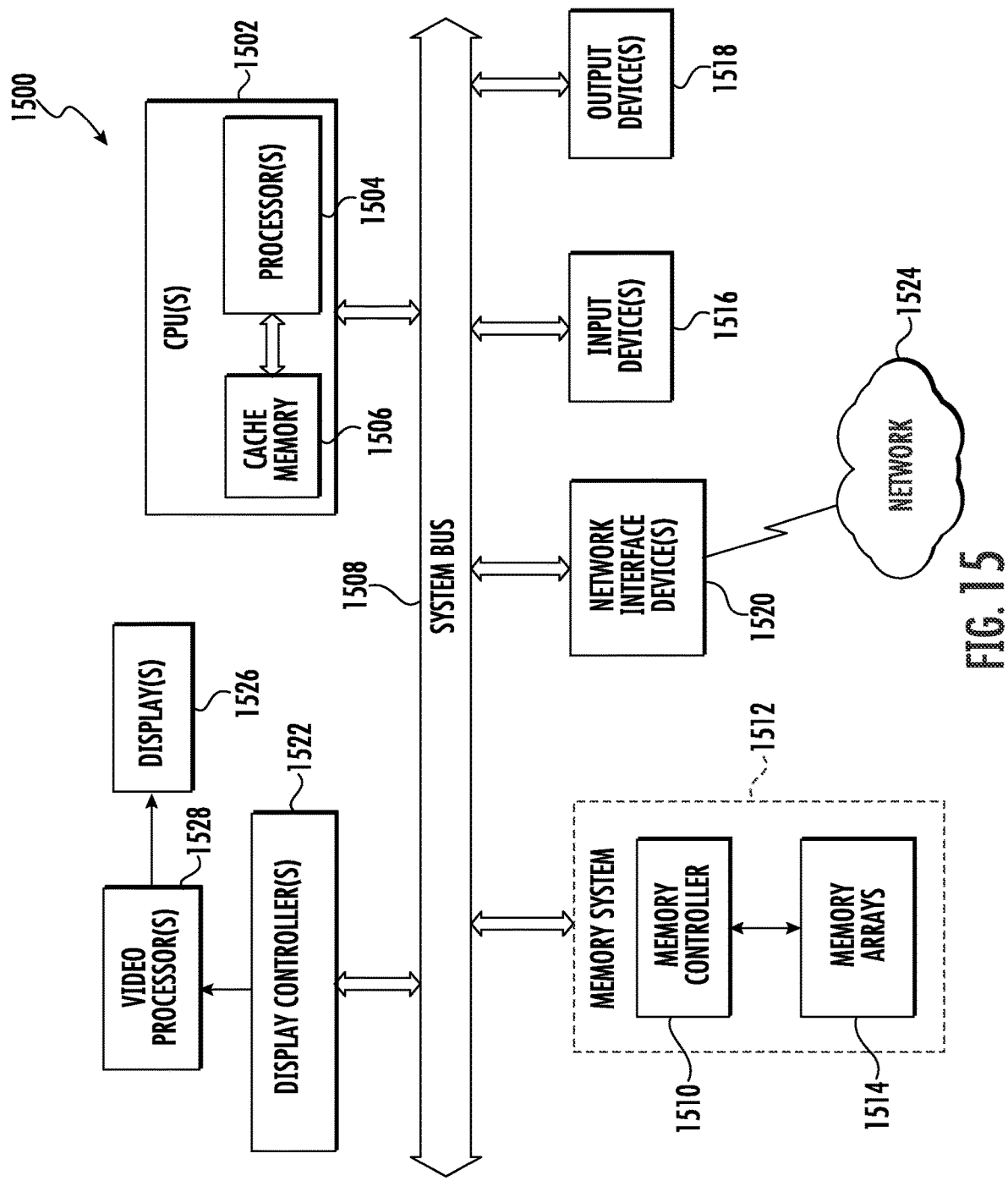
FIG. 15 is a block diagram of an exemplary processor-based system that can include the monolithic 3D CFET circuit of any of FIG. 1 and FIGS. 3-13.

FIG. 15 illustrates an example of a processor-based system 1500 including circuits including an exemplary monolithic 3D CFET circuit including CFET structures with upper FETs of a first type above lower FETs of a second type and configured as either NAND or NOR circuits, as illustrated in FIGS. 1 and 2-13, and according to any aspects disclosed herein. In this example, the processor-based system 1500 includes one or more central processor units (CPUs) 1502, which may also be referred to as CPU or processor cores, each including one or more processors 1504. The CPU(s) 1502 may have cache memory 1506 coupled to the processor(s) 1504 for rapid access to temporarily stored data. The CPU(s) 1502 is coupled to a system bus 1508 and can intercouple master and slave devices included in the processor-based system 1500. As is well known, the CPU(s) 1502 communicates with these other devices by exchanging address, control, and data information over the system bus 1508. For example, the CPU(s) 1502 can communicate bus transaction requests to a memory controller 1510 as an example of a slave device. Although not illustrated in FIG. 15, multiple system buses 1508 could be provided; wherein each system bus 1508 constitutes a different fabric.

Other master and slave devices can be connected to the system bus 1508. As illustrated in FIG. 15, these devices can include a memory system 1512 that includes the memory controller 1510 and one or more memory arrays 1514, one or more input devices 1516, one or more output devices 1518, one or more network interface devices 1520, and one or more display controllers 1522, as examples. The input device(s) 1516 can include any type of input device, including, but not limited to, input keys, switches, voice processors, etc. The output device(s) 1518 can include any type of output device, including, but not limited to, audio, video, other visual indicators, etc. The network interface device(s) 1520 can be any device configured to allow an exchange of data to and from a network 1524. The network 1524 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1520 can be configured to support any type of communications protocol desired.

The CPU(s) 1502 may also be configured to access the display controller(s) 1522 over the system bus 1508 to control information sent to one or more displays 1526. The display controller(s) 1522 sends information to the display(s) 1526 to be displayed via one or more video processors 1528, which process the information to be displayed into a format suitable for the display(s) 1526. The display(s) 1526 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or another computer-readable medium and executed by a processor or other processing device, or combinations of both. As examples, the master and slave devices described herein may be employed in any circuit, hardware component, IC, or IC chip. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A complementary field-effect transistor (CFET) circuit, comprising:
    a device layer, comprising:
        a first monolithic CFET structure comprising a first FET of a first type on a second FET of a second type; and
        a second monolithic CFET structure comprising a third FET of the first type on a fourth FET of the second type;
    a first interconnect layer disposed on the device layer, the first interconnect layer comprising:
        a first input contact configured to couple a first input signal to a gate of the first FET and to a gate of the second FET;
        a second input contact configured to couple a second input signal to a gate of the third FET and to a gate of the fourth FET; and
        an output contact configured to generate an output signal based on a logical operation of the first input signal and the second input signal.

2. The CFET circuit of clause 1, further comprising a first interconnect extending in the first interconnect layer in a second direction to couple a first source/drain of the first FET on a first side of the first monolithic CFET structure to a first source/drain of the third FET on a first side of the second monolithic CFET structure, wherein the first side of the first monolithic CFET structure and the first side of the second monolithic CFET structure are between the first monolithic CFET structure and the second monolithic CFET structure.

3. The CFET circuit of clause 1 or clause 2, further comprising a two-input not-OR (NOR) circuit.

4. The CFET circuit of clause 1 or clause 2, further comprising a two-input not-AND (NAND) circuit.

5. The CFET circuit of any of clause 1 to clause 4, the device layer further comprising:
    a first upper via extending from the first source/drain of the first FET to the first interconnect layer on the first side of the first monolithic CFET structure;
    a second upper via extending from the first source/drain of the third FET to the first interconnect layer on the first side of the second monolithic CFET structure;
    a third upper via extending from a second source/drain of the first FET to the first interconnect layer on a second side of the first monolithic CFET structure;
    a fourth upper via extending from a second source/drain of the third FET to the first interconnect layer on a second side of the second monolithic CFET structure;
    a fifth upper via coupling the gate of the first FET and the gate of the second FET to the first interconnect layer; and
    a sixth upper via coupling a gate of the third FET and a gate of the fourth FET to the first interconnect layer.

6. The CFET circuit of any of clause 1 to clause 5, the device layer further comprising:
    a first lower via extending from a first source/drain of the second FET to the first interconnect layer on the first side of the first monolithic CFET structure;
    a second lower via extending from a first source/drain of the fourth FET to the first interconnect layer on the first side of the second monolithic CFET structure;
    a third lower via extending from a second source/drain of the second FET to the first interconnect layer on the second side of the first monolithic CFET structure; and
    a fourth lower via extending from a second source/drain of the fourth FET to the first interconnect layer on the second side of the first monolithic CFET structure.

7. The CFET circuit of any of clause 1 to clause 5, wherein:
    the first source/drain of the first FET is coupled to a first channel region on the first side of the first FET and the second source/drain of the first FET is coupled to the first channel region on the second side of the first FET;
    the first source/drain of the second FET is coupled to a second channel region on the first side of the second FET and the second source/drain of the second FET is coupled to the second channel region on the second side of the second FET;
    the first source/drain of the first FET comprises a first source/drain width in the second direction;
    the first source/drain of the second FET comprises a second source/drain width in the second direction, the second source/drain width exceeding the first source/drain width; and
    the device layer further comprises a seventh upper via extending from a first source/drain of the second FET to the first interconnect layer on the first side of the first monolithic CFET structure.

8. The CFET circuit of clause 7, wherein:
    the second source/drain of the first FET comprises the first source/drain width;
    the first source/drain of the third FET comprises the first source/drain width;
    the second source/drain of the third FET comprises the first source/drain width;
    the second source/drain of the second FET comprises the second source/drain width;
    the first source/drain of the fourth FET comprises the second source/drain width;
    the second source/drain of the fourth FET comprises the second source/drain width;
    an eighth upper via extends from the second source/drain of the second FET to the first interconnect layer on the second side of the first monolithic CFET structure;
    a ninth upper via extends from the first source/drain of the fourth FET to the first interconnect layer on the first side of the second monolithic CFET structure; and
    a tenth upper via extends from the second source/drain of the fourth FET to the first interconnect layer on the second side of the second monolithic CFET structure.

9. The CFET circuit of clause 5, further comprising a second interconnect layer disposed below the device layer, wherein:
   the device layer further comprises:
      a first lower via extending from a first source/drain of the second FET to the second interconnect layer on the first side of the first monolithic CFET structure;
      a second lower via extending from a first source/drain of the fourth FET to the second interconnect layer on the first side of the second monolithic CFET structure;
      a third lower via extending from a second source/drain of the second FET to the second interconnect layer on the second side of the first monolithic CFET structure;
      a fourth lower via extending from a second source/drain of the fourth FET to the second interconnect layer on the second side of the second monolithic CFET structure;
      a fifth via coupled to the third lower via through the second interconnect layer and extending between the second interconnect layer and the first interconnect layer on the second side of the first monolithic CFET structure; and
      a sixth via coupled to the fourth lower via through the second interconnect layer and extending between the second interconnect layer and the first interconnect layer on the second side of the second monolithic CFET structure; and
   the second interconnect layer further comprises a lower interconnect coupled to the first lower via and the second lower via.

10. The CFET circuit of any of clause 1 to clause 9, further comprising a semiconductor substrate,
   wherein the first FET, the second FET, the third FET, and the fourth FET comprise bulk-type transistors formed on the semiconductor substrate.

11. The CFET circuit of any of clause 1 to clause 9, further comprising an oxide layer,
   wherein the first FET, the second FET, the third FET, and the fourth FET further comprise silicon-on-insulator (SOI) type transistors formed on the oxide layer.

12. The CFET circuit of any of clause 2 to clause 11, further comprising an external interconnect coupling the second source/drain of the third FET to the second source/drain of the second FET and to the second source/drain of the fourth FET.

13. The CFET circuit of any of clause 2 to clause 11, further comprising an external interconnect coupling the second source/drain of the third FET to the second source/drain of the first FET and to the second source/drain of the fourth FET.

14. The CFET circuit of any of clause 2 to clause 8, clause 10, and clause 11, further comprising an external interconnect coupling the first source/drain of the first FET to the first source/drain of the third FET.

15. The CFET circuit of any of clause 2 to clause 8, clause 10, and clause 11, further comprising an external interconnect coupling the first source/drain of the first FET to the second source/drain of the fourth FET and the second source/drain of the third FET.

16. The CFET circuit of any of clause 1 to clause 15, wherein each of the first FET, the second FET, the third FET, and the fourth FET comprise a channel region comprising at least one nano slab or nanowire.

17. The CFET circuit of any of clause 1 to clause 16 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. An integrated circuit (IC) comprising:
   a processor;
   a complementary field-effect transistor (CFET) circuit coupled to the processor, the CFET circuit comprising:
      a device layer,
         a first monolithic CFET structure comprising a first FET of a first type above a second FET of a second type; and
         a second monolithic CFET structure comprising a third FET of the first type above a fourth FET of the second type; and
      a first interconnect layer disposed on the device layer, the first interconnect layer comprising:
         a first input contact configured to couple a first input signal to a gate of the first FET and to a gate of the second FET;
         a second input contact configured to couple a second input signal to a gate of the third FET and to a gate of the fourth FET; and
         an output contact configured to generate an output signal based on a logical operation of the first input signal and the second input signal.

19. A method of forming a complementary field-effect transistor (CFET) circuit, the method comprising:
   forming a device layer, comprising:
      a first monolithic CFET structure comprising a first FET of a first type above a second FET of a second type; and
      a second monolithic CFET structure comprising a third FET of the first type above a fourth FET of the second type; and
   forming a first interconnect layer disposed on the device layer, the first interconnect layer comprising:
      a first input contact configured to couple a first input signal to a gate of the first FET and to a gate of the second FET;
      a second input contact configured to couple a second input signal to a gate of the third FET and to a gate of the fourth FET; and
      an output contact configured to generate an output signal based on a logical operation of the first input signal and the second input signal.

20. The method of clause 19, further comprising forming a first interconnect extending in the first interconnect layer in a second direction to couple a first source/drain of the first type of FET in the first monolithic CFET structure to a first source/drain of the first type of FET in the second monolithic CFET structure.

What is claimed is:

1. A complementary field-effect transistor (CFET) circuit, comprising:
    a device layer, comprising:
        a first monolithic CFET structure comprising a first FET of a first type on a second FET of a second type; and
        a second monolithic CFET structure comprising a third FET of the first type on a fourth FET of the second type;
    a first interconnect layer disposed on the device layer, the first interconnect layer comprising:
        a first input contact configured to couple a first input signal to a gate of the first FET and to a gate of the second FET;
        a second input contact configured to couple a second input signal to a gate of the third FET and to a gate of the fourth FET; and
        an output contact configured to generate an output signal based on a logical operation of the first input signal and the second input signal;
    a first interconnect extending in the first interconnect layer to couple a first source/drain of the first FET on a first side of the first monolithic CFET structure to a first source/drain of the third FET on a first side of the second monolithic CFET structure, wherein the first side of the first monolithic CFET structure and the first side of the second monolithic CFET structure are between the first monolithic CFET structure and the second monolithic CFET structure; and
    wherein the device layer further comprises:
        a first upper via extending from the first source/drain of the first FET to the first interconnect layer on the first side of the first monolithic CFET structure;
        a second upper via extending from the first source/drain of the third FET to the first interconnect layer on the first side of the second monolithic CFET structure;
        a third upper via extending from a second source/drain of the first FET to the first interconnect layer on a second side of the first monolithic CFET structure;
        a fourth upper via extending from a second source/drain of the third FET to the first interconnect layer on a second side of the second monolithic CFET structure;
        a fifth upper via coupling the gate of the first FET and the gate of the second FET to the first interconnect layer; and
        a sixth upper via coupling the gate of the third FET and the gate of the fourth FET to the first interconnect layer.

2. The CFET circuit of claim 1, further comprising an interconnect external to the device layer and the first interconnect layer and coupled to the second source/drain of the third FET to configure the CFET circuit as a two-input not-OR (NOR) circuit.

3. The CFET circuit of claim 1, further comprising an interconnect external to the device layer and the first interconnect layer and coupled to the second source/drain of the third FET to configure the CFET circuit as a two-input not-AND (NAND) circuit.

4. The CFET circuit of claim 1, the device layer further comprising:
    a first lower via extending from a first source/drain of the second FET to the first interconnect layer on the first side of the first monolithic CFET structure;
    a second lower via extending from a first source/drain of the fourth FET to the first interconnect layer on the first side of the second monolithic CFET structure;
    a third lower via extending from a second source/drain of the second FET to the first interconnect layer on the second side of the first monolithic CFET structure; and
    a fourth lower via extending from a second source/drain of the fourth FET to the first interconnect layer on the second side of the first monolithic CFET structure.

5. The CFET circuit of claim 1, wherein:
    the first source/drain of the first FET is coupled to a first channel region on the first side of the first monolithic CFET structure and the second source/drain of the first FET is coupled to the first channel region on the second side of the first monolithic CFET structure;
    a first source/drain of the second FET is coupled to a second channel region on the first side of the first monolithic CFET structure and a second source/drain of the second FET is coupled to the second channel region on the second side of the first monolithic CFET structure;
    the first source/drain of the first FET comprises a first source/drain width;
    the first source/drain of the second FET comprises a second source/drain width exceeding the first source/drain width; and
    the device layer further comprises a seventh upper via extending from the first source/drain of the second FET to the first interconnect layer on the first side of the first monolithic CFET structure.

6. The CFET circuit of claim 5, wherein:
    the second source/drain of the first FET comprises the first source/drain width;
    the first source/drain of the third FET comprises the first source/drain width;
    the second source/drain of the third FET comprises the first source/drain width;
    the second source/drain of the second FET comprises the second source/drain width;
    a first source/drain of the fourth FET comprises the second source/drain width;
    a second source/drain of the fourth FET comprises the second source/drain width;
    an eighth upper via extends from the second source/drain of the second FET to the first interconnect layer on the second side of the first monolithic CFET structure;
    a ninth upper via extends from the first source/drain of the fourth FET to the first interconnect layer on the first side of the second monolithic CFET structure; and
    a tenth upper via extends from the second source/drain of the fourth FET to the first interconnect layer on the second side of the second monolithic CFET structure.

7. The CFET circuit of claim 1, further comprising a second interconnect layer disposed below the device layer, wherein:
    the device layer further comprises:
        a first lower via extending from a first source/drain of the second FET to the second interconnect layer on the first side of the first monolithic CFET structure;
        a second lower via extending from a first source/drain of the fourth FET to the second interconnect layer on the first side of the second monolithic CFET structure;
        a third lower via extending from a second source/drain of the second FET to the second interconnect layer on the second side of the first monolithic CFET structure;

a fourth lower via extending from a second source/drain of the fourth FET to the second interconnect layer on the second side of the second monolithic CFET structure;

a fifth via coupled to the third lower via through the second interconnect layer and extending between the second interconnect layer and the first interconnect layer on the second side of the first monolithic CFET structure; and a sixth via coupled to the fourth lower via through the second interconnect layer and extending between the second interconnect layer and the first interconnect layer on the second side of the second monolithic CFET structure; and the second interconnect layer further comprises a lower interconnect coupled to the first lower via and the second lower via.

8. The CFET circuit of claim 1, further comprising a semiconductor substrate, wherein the first FET, the second FET, the third FET, and the fourth FET comprise bulk-type transistors formed on the semiconductor substrate.

9. The CFET circuit of claim 1, further comprising an oxide layer, wherein the first FET, the second FET, the third FET, and the fourth FET further comprise silicon-on-insulator (SOI) type transistors formed on the oxide layer.

10. The CFET circuit of claim 1, further comprising an interconnect external to the device layer and the first interconnect layer and coupling the second source/drain of the third FET to a second source/drain of the second FET and to a second source/drain of the fourth FET.

11. The CFET circuit of claim 1, further comprising an interconnect external to the device layer and the first interconnect layer and coupling the second source/drain of the third FET to the second source/drain of the first FET and to a second source/drain of the fourth FET.

12. The CFET circuit of claim 1, further comprising an interconnect external to the device layer and the first interconnect layer and coupling the first source/drain of the first FET to the first source/drain of the third FET.

13. The CFET circuit of claim 1, further comprising an interconnect external to the device layer and the first interconnect layer and coupling the first source/drain of the first FET to a second source/drain of the fourth FET and the second source/drain of the third FET.

14. The CFET circuit of claim 1, wherein each of the first FET, the second FET, the third FET, and the fourth FET comprise a channel region comprising at least one nano slab or nanowire.

15. A processor-based device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter, comprising the CFET circuit of claim 1.

16. An integrated circuit (IC) comprising:

a processor;

a complementary field-effect transistor (CFET) circuit coupled to the processor, the CFET circuit comprising:

a device layer, comprising:

a first monolithic CFET structure comprising a first FET of a first type above a second FET of a second type; and a second monolithic CFET structure comprising a third FET of the first type above a fourth FET of the second type;

a first interconnect layer disposed on the device layer, the first interconnect layer comprising:

a first input contact configured to couple a first input signal to a gate of the first FET and to a gate of the second FET;

a second input contact configured to couple a second input signal to a gate of the third FET and to a gate of the fourth FET; and an output contact configured to generate an output signal based on a logical operation of the first input signal and the second input signal;

a first interconnect extending in the first interconnect layer to couple a first source/drain of the first FET on a first side of the first monolithic CFET structure to a first source/drain of the third FET on a first side of the second monolithic CFET structure, wherein the first side of the first monolithic CFET structure and the first side of the second monolithic CFET structure are between the first monolithic CFET structure and the second monolithic CFET structure; and wherein the device layer further comprises:

a first upper via extending from the first source/drain of the first FET to the first interconnect layer on the first side of the first monolithic CFET structure;

a second upper via extending from the first source/drain of the third FET to the first interconnect layer on the first side of the second monolithic CFET structure;

a third upper via extending from a second source/drain of the first FET to the first interconnect layer on a second side of the first monolithic CFET structure;

a fourth upper via extending from a second source/drain of the third FET to the first interconnect layer on a second side of the second monolithic CFET structure;

a fifth upper via coupling the gate of the first FET and the gate of the second FET to the first interconnect layer; and a sixth upper via coupling the gate of the third FET and the gate of the fourth FET to the first interconnect layer.

17. A method of forming a complementary field-effect transistor (CFET) circuit, the method comprising:

forming a device layer, comprising:

a first monolithic CFET structure comprising a first FET of a first type above a second FET of a second type; and a second monolithic CFET structure comprising a third FET of the first type above a fourth FET of the second type;

forming a first interconnect layer disposed on the device layer, the first interconnect layer comprising:
- a first input contact configured to couple a first input signal to a gate of the first FET and to a gate of the second FET;
- a second input contact configured to couple a second input signal to a gate of the third FET and to a gate of the fourth FET; and
- an output contact configured to generate an output signal based on a logical operation of the first input signal and the second input signal;

forming a first interconnect extending in the first interconnect layer to couple a first source/drain of the first FET on a first side of the first monolithic CFET structure to a first source/drain of the third FET on a first side of the second monolithic CFET structure, wherein the first side of the first monolithic CFET structure and the first side of the second monolithic CFET structure are between the first monolithic CFET structure and the second monolithic CFET structure; and wherein forming the device layer further comprises:
- forming a first upper via extending from the first source/drain of the first FET to the first interconnect layer on the first side of the first monolithic CFET structure;
- forming a second upper via extending from the first source/drain of the third FET to the first interconnect layer on the first side of the second monolithic CFET structure;
- forming a third upper via extending from a second source/drain of the first FET to the first interconnect layer on a second side of the first monolithic CFET structure;
- forming a fourth upper via extending from a second source/drain of the third FET to the first interconnect layer on a second side of the second monolithic CFET structure;
- forming a fifth upper via coupling the gate of the first FET and the gate of the second FET to the first interconnect layer; and
- forming a sixth upper via coupling the gate of the third FET and the gate of the fourth FET to the first interconnect layer.

* * * * *